(12) United States Patent
Ami et al.

(10) Patent No.: US 6,610,548 B1
(45) Date of Patent: Aug. 26, 2003

(54) CRYSTAL GROWTH METHOD OF OXIDE, CERIUM OXIDE, PROMETHIUM OXIDE, MULTI-LAYERED STRUCTURE OF OXIDES, MANUFACTURING METHOD OF FIELD EFFECT TRANSISTOR, MANUFACTURING METHOD OF FERROELECTRIC NON-VOLATILE MEMORY AND FERROELECTRIC NON-VOLATILE MEMORY

(75) Inventors: Takaaki Ami, Kanagawa (JP); Yuichi Ishida, Kanagawa (JP); Naomi Nagasawa, Kanagawa (JP); Masayuki Suzuki, Kanagawa (JP); Akio Machida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/532,793

(22) Filed: Mar. 22, 2000

(30) Foreign Application Priority Data

Mar. 26, 1999 (JP) .......................................... P11-084919

(51) Int. Cl.$^7$ .............................................. H01L 21/00
(52) U.S. Cl. ............................ 438/3; 438/660; 438/663; 438/763
(58) Field of Search .......................... 438/3, 479, 763, 438/660, 663, 795; 257/295, 310; 428/694 ST, 694 TP, 694 TS, 472; 117/944

(56) References Cited

U.S. PATENT DOCUMENTS 5,296,458 A * 3/1994 Himpsel ........................ 505/1
6,121,647 A * 9/2000 Yano et al. .................. 257/295

* cited by examiner

Primary Examiner—Olik Chaudhuri
Assistant Examiner—Hsien-Ming Lee
(74) Attorney, Agent, or Firm—Sonnenschein, Nath & Rosenthal

(57) ABSTRACT

An epitaxial rare earth oxide (001)/silicon (001) structure is realized by epitaxially growing a rare earth oxide such as cerium dioxide in the (001) orientation on a (001)-oriented silicon substrate. For this purpose, the surface of the (001)-oriented Si substrate is processed into a dimer structure by 2×1, 1×2 surface reconstruction, and a rare earth oxide of a cubic system or a tetragonal system, such as $CeO_2$ film, is epitaxially grown in the (001) orientation on the Si substrate by molecular beam epitaxy, for example. During this growth, a source material containing at least one kind of rare earth element is supplied after the supply of an oxidic gas is supplied onto the surface of the Si substrate. If necessary, annealing is conducted in vacuum after the growth.

29 Claims, 21 Drawing Sheets

HOMOEPITAXIALLY GROWN $CeO_2$ FILM
(SECOND GROWTH TEMPERATURE)

AMORPHOUS $CeO_y$
(FIRST GROWTH TEMPERATURE)

$SiO_x$ FILM (001) Si SUBSTRATE

SURFACE HAVING FORMED THE DIMER STRUCTURE
BY 2x1, 1x2 SURFACE RECONSTRUCTION

CeO₂ (001) FILM <100> INCIDENCE

CeO₂ (001) FILM <100> INCIDENCE

CeO₂ (001) FILM  <110> INCIDENCE

CeO₂ (001) FILM  <110> INCIDENCE

CeO$_2$ (001) FILM   〈100〉 INCIDENCE

AS GROWN (ROOM TEMPERATURE)

(TRANSMISSION TYPE)

CeO$_2$ (001) FILM   〈100〉 INCIDENCE

ANNEALED IN VACUUM
300°C
(STREAK)

CeO₂ (001) FILM  ⟨100⟩ INCIDENCE

ANNEALED IN VACUUM
600°C (SUPERLATTICE SPOT)

CeO₂ (001) FILM  ⟨110⟩ INCIDENCE

AS GROWN (ROOM TEMPERATURE)

(TRANSMISSION TYPE)

CeO$_2$ (001) FILM  ⟨110⟩ INCIDENCE

ANNEALED IN VACUUM
300°C
(STREAK)

CeO$_2$ (001) FILM  ⟨110⟩ INCIDENCE

ANNEALED IN VACUUM
600°C
(SUPERLATTICE SPOT)

$CeO_{2-x}$ (001)  ⟨110⟩ INCIDENCE

CeO₂ (001) FILM  ⟨100⟩ INCIDENCE

CeO₂ (001) FILM  ⟨100⟩ INCIDENCE

CRYSTAL GROWTH METHOD OF OXIDE, CERIUM OXIDE, PROMETHIUM OXIDE, MULTI-LAYERED STRUCTURE OF OXIDES, MANUFACTURING METHOD OF FIELD EFFECT TRANSISTOR, MANUFACTURING METHOD OF FERROELECTRIC NON-VOLATILE MEMORY AND FERROELECTRIC NON-VOLATILE MEMORY

BACKGROUND OF THE INVENTION

1. Field of the Invention

This invention relates. to a crystal growth method of oxide, cerium oxides, promethium oxides, multi-layered structure of oxides, manufacturing method of field effect transistor, field effect transistors, manufacturing method of ferroelectrics non-volatile memory and ferroelectric non-volatile memory, which are particularly suitable for use to oxide electronics developed on silicon substrates.

2. Description of the Related Art

Silicon oxide ($SiO_2$) films made by thermal oxidation of silicon (Si) have been exclusively used as gate insulating films of MOS-FET (metal-oxide-semiconductor FET) because of their high electric insulating ability, low interface state density, easiness to process, thermal stability, and other advantages. These $SiO_2$ films made by thermal oxidation for use as gate insulating films, however, have low specific dielectric constants ($\epsilon_r$~3.8) and must be formed very thin on Si substrates. Along with the progress toward thinner gate insulating films, short channels and other requirements to meet the demand for integration, various problems arose such as dielectric break-down of gate insulating films and pinch-off of channels caused by influences from source-drain voltages (short channel effect), and gate insulating films will soon come to limit in terms of their materials. Under the circumstances, the need for new gate insulating films having high dielectric constants is being advocated as a technical subject of MOS-FET of the sub 0.1 micron generation, in addition to a further progress of lithographic technologies, needless to say (for example, (1) MTL VLSI Seminar (Massachusetts Institute of Technology)). If a gate insulating film can be made by using a material of a high dielectric constant, it will need not be so thin. Therefore, gate leakage will be prevented, and short-channel effects will be prevented as well.

On the other hand, researches on ferroelectric non-volatile memories (FeRAM) have come to be active (for example, (2) Appl. Phys. Lett., 48(1986)1439, (3) IEDM Tech. Dig., (1987)850, (4) IEEE J. Solid State Circuits, 23(1988)1171, (5) 1988 IEEE Int. Solid-State Circuits Conf. (ISSCC88), (6) Digest of Technical Papers, THAM 10.6 (1988)130, and (7) Oyo Butsuri, 62(1993)1212). Among these ferroelectric non-volatile memories, what is considered to be closest to practical use is a ferroelectric non-volatile memory of a quasi-DRAM structure (using two-transistors and two-capacitors type memory cells, or one-transistor and one-capacitor type memory cells). This structure is advantageous in making it easier to prevent interference with the Si process because CMOS process and ferroelectric capacitor process can be separated by using an inter-layer insulating film. However, the structure of this ferroelectric non-volatile memory does not meet the use of a scaling law of a Si device. Therefore, as microminiaturization progresses, it is necessary to employ a more complex structure or use a material with a larger value of residual polarization in order to ensure a certain amount of charge storage in the capacitor. On the other hand, there are many research institutes tackling with the study of ferroelectric non-volatile memories using MFS-FETs (metal-ferroelectrics-semiconductor)-FET type memory cells, including MFMIS (metal-ferroelectrics-metalinsulator-semiconductor)-FET type memory cells, FCG (ferroelectric capacitor gate) type memory cells, and so forth), which constitute two major subjects together with those of a quasi-DRAM structure mentioned above. The latter type ferroelectric non-volatile memories match with the scaling low, and merely need a very small value of residual polarization (about ~0.1 $\mu C/cm^2$). Additionally, since they need only one transistor for storage and hence contribute to a decrease of the cell size, they are advantageous for high integration. Furthermore, since they are of a nondestructive readout type, they are more advantageous also against fatigue, which might be an essential problem of ferroelectric materials, than destructive readout type memory cells with two transistors and two capacitors, or one transistor and one capacitor, and are also available for high-speed operations. Because these excellent properties are expected, MFS-FET ferroelectric non-volatile memories are now recognized as ultimate memories ((8) Appl. Surf. Sci. 113/114(1997)656).

It is problems with their manufacturing process that prevent practical use of these MFS-FET ferroelectric non-volatile memories. It is extremely difficult to grow ferroelectric materials directly on Si substrates. Therefore, growth of buffer layers of insulating materials on Si substrates is recognized as one of most important technologies. In case of a MFIS (metal-ferroelectrics-insulator-semiconductor)-FET ferroelectric non-volatile memories which is one of MFS-FET ferroelectric non-volatile memories, gate voltage is distributed to an insulating layer as well, and this causes the drawback that the write voltage is high. To prevent it, the insulating layer must be one with a high dielectric constant. On the other hand, material properties required as a ferroelectric material used here are a low dielectric constant, appropriate value of residual polarization (typically around ~0.1 $\mu C/cm^2$, although depending upon the device design), and most seriously, good squareness ratio. Additionally, for the purpose of realizing a better interface, it is the important condition that these materials can be grown at low temperatures. Thus, choice and development of materials is required from the standpoint different from that of the one-transistor and one-capacitor type. There are a lot of is research reports on MFIS-FET ferroelectric non-volatile memories. However, because of insufficient surface properties, there is almost no reports about practically usable ones including the requirement for retention (charge retaining property). On the other hand, a MFMIS structure enabling the use of an existing $SiO_2$ film by thermal oxidation as the gate insulating film is also under consideration ((9) Jpn. J. Appl. Phys., 33(1994) 5207), and this is considered to be relatively close to the stage of practical use. There is also proposed an approach stepping forward from that by separately making a ferroelectric capacitor and connecting it to a polycrystalline Si gate by wiring ((10) Japanese Patent Laid-Open Publication No. hei 8-250608 and (11) Japanese Patent Laid-Open Publication No. hei 9-205181). This method facilitates device isolation between a ferroelectric material and a Si transistor, and at the same time, because the design choice in areal ratio between the capacitor and the gate, sufficient polarization can be obtained with a low write voltage by reducing the relative area of the capacitor. However, it is difficult to reliably obtain a necessary squareness ratio with polycrystalline ferroelectric materials, and this method will also encounter the limit of the material of the $SiO_2$ film by thermal oxidation in progress of microminiaturization. Eventually, also the key technology for realizing MFS-FET ferroelectric non-volatile memories is just the growth of an insulating film with a high dielectric constant on a Si substrate. Moreover, in order to realize a steep interface and a low interface state density equivalent to $SiO_2$ films by thermal oxidation, it is advantageous to epitaxially grow a material good in lattice matching, and there is such an extremely high technical hurdle that a channel can be made in the Si<110> orientation having the largest mobility of Si as the substrate and it should be on a Si(001) substrate being used exclusively as the MOS-FET substrate.

On the other hand, it is greatly significant to introduce oxide materials other than $SiO_2$ into the semiconductor industry. High-temperature superconductive materials discovered in 1986 ((12) Z. Phys. B., 64, 189–193(1986)), needless to say, and oxide materials especially having perovskite or related structures have very important physical properties for semiconductor devices, such as ferroelectricity, high dielectric constant, superconductivity, colossal magnetoresistance, and so forth ((13) Mater. Sci. Eng., B41(1996)166, and (14) J. Ceram. Soc. Japan, Int. Ed., 103(1995)1088). For example, among ferroelectric materials of capacitors for ferroelectric non-volatile memories mentioned above, zirconium titanate (PZT) having a large value of spontaneous polarization and a low process temperature (for example, (15) J. Appl. Phys. 70, 382–388 (1991)) and bismuth strontium tantalate ($Bi_2SrTa_2O_9$ ((16) Nature, 374(1995)627, (17) Appl. Phys. Lett., 66(1995)221, (18) Mater. Sci. Eng., B32(1995)75, (19) Mater. Sci. Eng., B32(1995)83, (20) Appl. Phys. Lett., 67(1995)572, (21) J. Appl. Phys., 78(1995)5073, (22) Appl. Phys. Lett., 68(1996) 566, (23) Appl. Phys. Lett., 68(1996)690, and (24) International Laid-Open Publication WO93/12542) are the twin greatest materials. Furthermore, including the discovery of colossal magnetoresistance materials (CMR materials) in the group of Mn oxides, which are variable in resistivity over some digits under application of a magnetic field ((25) Phys. Rev. Lett. 74(1995)5108), great interest has come to be attracted to how high potential capacities these oxide materials have ((26) Mater. Sci. Eng., B41(1996)166, and (27) J. Ceram. Soc. Japan, Int. Ed., 103(1995)1088), and technologies for making thin oxide films have been developed remarkably in these ten years or so.

If oxide materials having these very high functional physical properties can be developed on Si which is the basis of the semiconductor industry, these materials will get a high marketability. However, because of difficulties between these functional oxide materials and Si, such as mutual thermal diffusion and differences in thermal expansion coefficient, it is usually difficult to directly grow these functional oxide materials on Si.

As discussed above, almost all of these functional oxide materials have structure based on a perovskite structure. Many of them, such as yttrium-based superconductive materials having critical temperatures beyond the liquid nitrogen temperature and $Bi_2SrTa_2O_9$ mentioned above, have structures called layered perovskite having a very large anisotropy. In these layered perovskite structured oxides, superconductive current paths, polarization axes, etc. are limited to specific directions, and also in case of simple perovskite structured oxides, there are many in which polarization axes are limited to specific directions like that in PZT. Therefore, when they are used to make devices, it is important to specifically orient oxides, or more preferably, epitaxially grow them relative to bases, in order to draw out their maximum properties.

Ceria (cerium dioxide: $CeO_2$) having a fluorite structure is one of candidates for materials of gate insulating films with high dielectric constants for the sub 0.1 micron generation to substitute for $SiO_2$ films by thermal oxidation because of its thermal stability, high specific dielectric constant ($\epsilon_r \sim 26$) and very good lattice matching with Si substrates (misfit: about 0.35%), and it is considered to be one of most ideal buffer layer materials for epitaxially growing perovskite-related oxides on Si substrates. Actually, researches are being made on epitaxial growth of ceria on Si substrates, but most of them are directed to $CeO_2(111)/Si(111)$ structures easy for atomic close-packed growth (for example, (28) Jpn. J. Appl. Phys. 34(1995), L688, and (29) Japanese Patent Laid-Open Publication No. hei 7-25698). However, with regard to Si(001) substrates which are most important for practical application, there is the story that, under the recognition that the epitaxial $CeO_2(001)/Si(001)$ structure was just the ideal structure, various proposal were made on multi-layered structures, devices, and so on ((30) Japanese Patent Laid-Open Publication No. hei 2-267104, (31) Japanese Patent Laid-Open Publication No. hei 6-97452, (32) Japanese Patent Laid-Open Publication No. hei 10-182292, and others), but it was not realized. Heretofore, it has been believed that $CeO_2(110)$ having an antiphase domain epitaxially grows, reflecting the dimer structure by the surface reconstructed structure of Si(001)–2×1, 1×2. Further, regarding the growth temperature, it is considered that a temperature around 800° C. at which no $SiO_2$ film is formed on the Si surface in a high vacuum ((33) J. Vac. Sci. Technol. A13(1995)772) is the lower limit of epitaxial temperature ((34) Jpn. J. Appl. Phys. 33(1994), 5219, (35) Appl. Phys. Lett. 56 (1990), 1332, (36) Appl. Phys. Lett. 59(1991), 3604, (37) Physica C 192 (1992)154, (38) Jpn. J. Appl. Phys. 36(1997), 5253, and (39) Japanese Patent Laid-Open Publication No. hei 9-64206). Furthermore, under the belief that the growth temperature must be lowered to obtain a steep interface, electron beam assisted epitaxial growth, for example, is under trial. However, the lower limit of epitaxial growth temperature heretofore reported is 710° C. ((40) 1998 spring symposium of Oyo Butsuri Gakkai, Presentation No. 28p-PA-1). Although there are a few reports on $CeO_2(001)/Si(001)$ structures, there is no experimental data ((41) Japanese Patent Laid-Open Publication No. hei 2-267104), no discussion is made about separation from substrate diffraction ((42) Solid State Comm. 108(1998) 225), and none could prove epitaxial growth. Although there are proposals of solid solution $(Ce, Zr)O_2$ of zirconia (zirconium dioxide: $ZrO_2$) and ceria ((43) Jpn. J. Appl. Phys. 35(1996), 5150), $CeO_2/(Ce, Zr)O_2/Si$ multi-layered structure ((44) Jpn. J. Appl. Phys. 36(1997), 5253 and (45) 1998 spring symposium of Oyo Buturi Gakkai, Paper 29p-ZF-4), and $CeO_2/SrTiO_3/Si$ structure ((46) Jpn. J. Appl. Phys. 30(1991)L1136), which use the solid solution as a buffer layer. However, it has not been reported at all that $CeO_2$ (001) could be epitaxially grown directly on a Si(001) substrate.

Researches are being made also on yttria (yttrium oxide: $Y_2O_3$) having a C-rare-earth structure (bixbyite) because it has material properties similar to ceria. However, it involves the same problems as ceria, and in usual, $Y_2O_3(110)$ epitaxially grows on Si(001) substrates ((47) Appl. Phys. Lett. 71(1997), 903).

On the other hand, there is an example in which a perovskite oxide epitaxially grows on ceria (or yttria) (for example, (48) Appl. Phys. Lett. 68(1996)553). Therefore, if ceria can be controlled in orientation, a device making use of the characteristics of functional oxides will be realized.

Under these circumstances, technologies for epitaxially growing $CeO_2(001)$ on $Si(001)$ substrates most important for practical application are greatly important.

OBJECTS AND SUMMARY OF THE INVENTION

It is therefore an object of the invention to provide a method for crystal growth of oxides capable of epitaxially growing cerium oxide, yttrium oxide, and rare earth oxides having crystalline structures similar to them in the (001) orientation on (001)-oriented silicon substrates to realize epitaxial rare earth oxide(001)/silicon (001) structure; cerium oxides; promethium oxides; multi-layered structure of oxides; method for manufacturing a field effect transistor by using the method for crystal growth of oxides to make a gate insulating film; field effect transistor, method for manufacturing a ferroelectric non-volatile memory by using the method for crystal growth of oxides to make a ferroelectric capacitor; and ferroelectric non-volatile memory.

The Inventors made researches toward resolution of the above-discussed problems involved in the conventional technologies. Their outline is explained below. In the explanation made below, growth of cerium oxide is taken as a typical example.

To attain the object of the invention, it is important that the surface of a silicon substrate has steps and terraces at least once. This can be realized by the method proposed by Ishizaka and Shiraki et al ((49) J. Electrochem. Soc., 133 (1986)666), for example, or other similar methods. The growth apparatus is preferably one of molecular beam epitaxy (MBE) apparatus, laser ablation apparatus, reactive vacuum evaporation apparatus, and so forth, excellent in surface controllability and permitting to keep a clean surface in ultra high vacuum and permitting observation of the surface by reflection high energy electron diffraction (RHEED). Basically, however, any apparatus is acceptable provided it can control the pressure, temperature, and so on. When growing cerium dioxide ($CeO_2$), cerium dioxide itself is used as the source material of cerium in most cases. However, since oxygen with a low vapor pressure selectively volatilizes, it is desirable to use cerium metal in order to control a low oxygen partial pressure. But oxide source materials are considered usable if the high vacuum can be maintained by additionally using a getter pump, for example for evacuation of the growth chamber, for example. Cerium metal has a high melting point and a low vapor pressure, and it is desirable to vaporize it by using a high-temperature Knudsen cell, electron beam vapor deposition, excimer laser, or the like. Additionally, for controlling interaction of these gases or metal elements, etc. with the highly active surface of the silicon substrate, it is important to employ a low-temperature process. There is no description directed to surface treatment in reports given heretofore, and there is one reporting that epitaxial $CeO_2$ could be made on a silicon substrate by using cerium metal and activating it by RF plasma under a substrate temperature of 450° C. through 600° C. and a oxygen partial pressure of $(4~6) \times 10^{-4}$ Torr (assumed to be $10^{-2}$ Torr near the substrate) ((50) Japanese Patent Laid-Open Publication No. hei2-267104). However, there is no description on epitaxial growth orientations. In the ranges of substrate temperature and oxygen partial pressure taught therein, a $SiO_2$ film is made on the silicon substrate surface, and growth of epitaxial $CeO_2(001)$ does not follow. If RF plasma is applied for activation, reaction of this mode will be promoted further.

The Inventors made researches on conditions for epitaxial growth of $CeO_2(001)$ on silicon (001) substrates from various standpoints, including a decrease of the growth temperature to control rates of generating cerium silicide, silicon oxide, for example. In conclusion, it is essentially important to prepare the surface of the silicon (001) substrate in form of a dimer structure of 2×1 and 1×2 surface structure before the growth, and it is also important how the source material is supplied during the growth. Regarding the latter subject, method of supply the source material, it is important, more specifically, to first start the supply of oxidic gas like oxygen onto the silicon (001) substrate surface and subsequently start the supply of the source material of Ce. Its reason has not been clarified yet. However, it is presumed that the surface of the silicon (001) substrate is covered by molecules or atoms of oxidic gas like oxygen before the supply of the source material of Ce is started, and this promotes (001) epitaxial growth of $CeO_2$.

In addition to the above-mentioned matters, it is important to appropriately select the ratio of the supply amount of oxidic gas relative to the supply amount of the source material of Ce under a certain growth temperature, or the partial pressure of the oxidic gas or its supply amount when the supply amount of the source material of Ce is constant. FIG. 1 shows relationship between growth temperature T and ratio O/Ce of the supply amount of oxidic gas relative to the supply amount of the source material of Ce when the latter is constant. For convenience, shown on the ordinate of FIG. 1 are values of $O_2$ flow rate [sccm] instead of O/Ce. It is known from FIG. 1 that there is a certain restriction in the region where $CeO_2(001)$ can epitaxially grow. It is also known that the upper limit of the growth temperature is around 300° C. As the growth temperature decreases, the range of O/Ce or $O_2$ partial pressure increases. When it becomes lower than 100° C., a significant range can be obtained, and this is preferable for practical application.

The Inventors reached the present invention after making investigation from various viewpoints, in addition to the above-explained researches and knowledge.

According to the first aspect of the invention, there is provided a crystalline growth method of an oxide comprising the steps of:

processing a surface of a (001)-oriented silicon substrate into a dimer structure by 2×1, 1×2 surface reconstruction; and epitaxially growing a rare earth oxide of a cubic system or tetragonal system in the (001) orientation on the silicon substrate.

According to the second aspect of the invention, there is provided a crystalline growth method of an oxide comprising the steps of:

processing a surface of a (001)-oriented silicon substrate into a dimer structure by 2×1, 1×2 surface reconstruction; and epitaxially growing a rare earth oxide of a cubic system or tetragonal system in the (001) orientation on the silicon substrate by using a source material containing at least one kind of rare earth element in an atmosphere containing an oxidic gas.

In the second aspect of the invention, the rare earth oxide is epitaxially grown typically at a growth temperature lower than 300° C. and preferably a growth temperature not higher than 100° C.

According to the third aspect of the invention, there is provided a crystal growth method of an oxide comprising the steps of:

vaporizing a silicon oxide film from the surface of the (001)-oriented silicon substrate by heating it in vacuum with a pressure not higher than $1\times10^{-6}$ Torr; and epitaxially growing a rare earth oxide of a cubic system or tetragonal system in the (001) orientation on the silicon substrate from which the silicon oxide film is vaporized.

According to the fourth aspect of the invention, there is provided a cerium oxide having a bixbyite structure.

According to the fifth aspect of the invention, there is provided a promethium oxide having a bixbyite structure.

According to the sixth aspect of the invention, there is provided a multi-layered structure of oxides comprising:

a (001)-oriented silicon substrate;

a first $CeO_2$ film grown on the silicon substrate at a first growth temperature; and a second $CeO_2$ film epitaxially grown on the first $CeO_2$ film at a second growth temperature higher than the first growth temperature.

In the sixth aspect of the invention, the second $CeO_2$ film is typically (001)-oriented the first growth temperature is in the range from the room temperature to approximately 300° C., for example. A $SiO_x$ film may lie along the interface between the silicon substrate and the first $CeO_2$ film.

According to the seventh aspect of the invention, there is provided a multi-layered structure of oxides comprising:

a (001)-oriented silicon substrate;

a $SiO_x$ film on the silicon substrate;

an amorphous $CeO_y$ film on the $SiO_x$ film; and a (001)-oriented $CeO_2$ film epitaxially arranged with respect to the silicon substrate on the amorphous $CeO_y$ film.

In the sixth and seventh aspects of the invention, x of the $SiO_x$ film is normally in the range of $1 \leq x \times \leq 2$, and y of the amorphous $CeO_y$ film is normally in the range of $1.5 \leq y \leq 2$.

Oxides multi-layered structures accordingto the six aspect (with and without the $SiO_x$ film between the silicon substrate and the first $CeO_2$ film) and the seventh aspect of the invention can be illustrated as shown in FIGS. 2, 3 and 4, respectively.

According to the eighth aspect of the invention, there is provided a manufacturing method of a field effect transistor comprising the steps of:

processing a surface of a (001)-oriented silicon substrate into a dimer structure by 2×1, 1×2 surface reconstruction; and forming a gate insulating film by epitaxially growing a rare earth oxide of a cubic system or tetragonal system in the (001) orientation on the silicon substrate.

In the eighth aspect of the invention, the gate insulating film is formed by epitaxially growing the rare earth oxide on the silicon substrate typically at a growth temperature lower than 300° C. and preferably at a growth temperature lower than 100° C. It is also possible that the surface of the silicon substrate is processed into the dimer structure by heating the silicon substrate in vacuum with a pressure not higher than $1\times10^{-6}$ Torr and thereby vaporizing a silicon oxide film from the surface, and the gate insulating film is formed by epitaxially growing the rare earth oxide on the silicon substrate.

According to the ninth aspect of the invention, there is provided a manufacturing method of a field effect transistor comprising the steps of:

processing a surface of a (001)-oriented silicon substrate into a dimer structure by 2×1, 1×2 surface reconstruction; and forming a gate insulating film by epitaxially growing a rare earth oxide of a cubic system or tetragonal system in the (001) orientation on the silicon substrate in an atmosphere containing an oxidic gas at a growth temperature lower than 300° C. by using a source material containing at least one kind of rare earth element.

According to the tenth aspect of the invention, there is provided a manufacturing method of a field effect transistor comprising the steps of:

vaporizing a silicon oxide film from a surface of a (001)-oriented silicon substrate by heating the silicon substrate in vacuum with a pressure not higher than $1\times10^{-6}$ Torr;

forming a gate insulating film by epitaxially growing a rare earth oxide of a cubic system or tetragonal system in the (001) orientation on the silicon substrate from which the silicon oxide film is vaporized.

According to the eleventh aspect of the intention, there is provided a field effect transistor comprising:

a (001)-oriented silicon substrate;

a gate insulating film made of a (001)-oriented rare earth oxide of a cubic system or tetragonal system which is epitaxially grown on the silicon substrate; and a ferroelectric film epitaxially grown on the gate insulating film.

According to the twelfth aspect of the invention, there is provided a manufacturing method of a ferroelectric non-volatile memory, comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on the silicon substrate; and epitaxially growing a ferroelectric film on the rare earth oxide.

According to the thirteenth aspect of the invention, there is provided a ferroelectric non-volatile memory characterized in the use of a field effect transistor which includes:

a (001)-oriented silicon substrate;

a gate insulating film made of a (001)-oriented rare earth oxide of a cubic system or tetragonal system which is epitaxially grown on the silicon substrate; and a ferroelectric film epitaxially grown on the gate insulating film.

According to the fourteenth aspect of the invention, there is provided a ferroelectric non-volatile memory comprising:

a (001)-oriented silicon substrate;

a (001)-oriented rare earth oxide bf a cubic system or tetragonal system which is epitaxially grown on the surface of a first region of the silicon substrate;

a capacitor using a ferroelectric film which is epitaxially grown on the rare earth oxide; and MIS-FET formed in a second region of the silicon substrate, the capacitor and a gate electrode of the MIS-FET gate being connected to each other by wiring.

According to the fifteenth aspect of the invention, there is provided a ferroelectric non-volatile memory comprising:

a single-crystal insulating substrate;

a (001)-oriented rare earth oxide of a cubic system of tetragonal system which is epitaxially grown on the surface of a first region of the single-crystal insulating substrate;

a capacitor using a ferroelectric film which is epitaxially grown on the rare earth oxide; and MIS-FET formed in a silicon film which is epitaxially grown on the surface of a second region of the single-crystal insulating substrate, the capacitor and a gate electrode of the MIS-FET being connected to each other by wiring.

In the present invention, the (001)-oriented silicon substrate intends to involve a silicon substrate offset from the (001) orientation within a range which can be regarded to be substantially equivalent to the (001) orientation.

In the present invention, the rare earth oxide is any one of oxides of rare earth elements like cerium (Ce), yttrium (Y), and so forth, and may be an oxide of one kind of rare earth elements, or two or more kinds of rare earth elements. When the rare earth oxide is expressed as $ReO_z$ (where Re is one or more rare earth elements), $0<z\leq3$ is normally satisfied. Although the rare earth oxide is a cubic system or a tetragonal system, the cubic or tetragonal system includes those slightly distorted within a range which can be regarded as the cubic or tetragonal system substantially. The rare earth oxide typically takes a fluorite structure ($CeO_2$ structure) or a C-rare-earth structure ($Y_2O_3$ structure; bixbyite structure).

In the present invention, for the purpose of epitaxially growing the rare earth oxide in the (001) orientation more reliably, a source material containing at least one kind of rare earth element is supplied preferably after the oxidic gas is supplied onto the surface of the silicon substrate in the process of epitaxial growth of the rare earth oxide. The source material containing at least one kind of rare earth element may be either one made up of at least one kind of rare earth element or one made up of a rare earth oxide, for example. In this case, the rare earth element is a metal element.

In the present invention, a further step of annealing may be provided to anneal the rare earth oxide in vacuum of a pressure not higher than $1\times10^{-6}$ Torr at a temperature not lower than the growth temperature of the rare earth oxide after epitaxially growing the rare earth oxide. As a result of the annealing in the vacuum, part of oxygen is removed from the rare earth oxide. Especially when the rare earth oxide is $CeO_z$, by annealing it in vacuum of a pressure not higher than $1\times10^{-6}$ Torr at a temperature not lower than the growth temperature of $PmO_z$ after epitaxially growing $CeO_z$ and thereby removing part of O from $CeO_z$, $CeO_{z-d}$ having an oxygen-defective fluorite structure or a C-rare-earth structure (bixbyite structure) can be produced. In $CeO_{z-d}$, z–d is normally satisfies $1.5\leq z-d<2$, and typically satisfies $1.5\leq z-d\leq1.8$. Also when the rare earth oxide is $PmO_z$, $CeO_{z-d}$ having a bixbyite structure can be produced in the same manner. Additionally, a step is provided to homoepitaxially grow an additional rare earth oxide on the former rare earth oxide at a growth temperature higher than the growth temperature of the former rare earth oxide after its epitaxial growth. Further, another step may be provided to epitaxially grow a functional oxide on the rare earth oxide after its epitaxial growth.

In the present invention, depending upon the growth conditions, a silicon oxide film or defective layer not thicker than 5 nm may be formed along the interface between the silicon substrate and the rare earth oxide after growth of the rare earth oxide.

In the present invention, the functional oxide typically has a perovskite structure or a layered perovskite structure. Essentially, any can be the functional oxide, such as, for example, ferroelectric material, superconductive material, pyroelectric material and piezoelectric material.

According to the invention having the above-summarized structure, by processing the surface of a (001)-oriented silicon substrate into a dimer structure by 2×1, 1×2 surface reconstruction and preferably supplying a source material containing at least one kind of rare earth element after starting the supply of an oxidic gas onto the surface of the silicon substrate in the process of epitaxial growth of a rare earth oxide, the rare earth oxide can be epitaxially grown excellently in the (001) orientation on the (001)-oriented silicon substrate.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
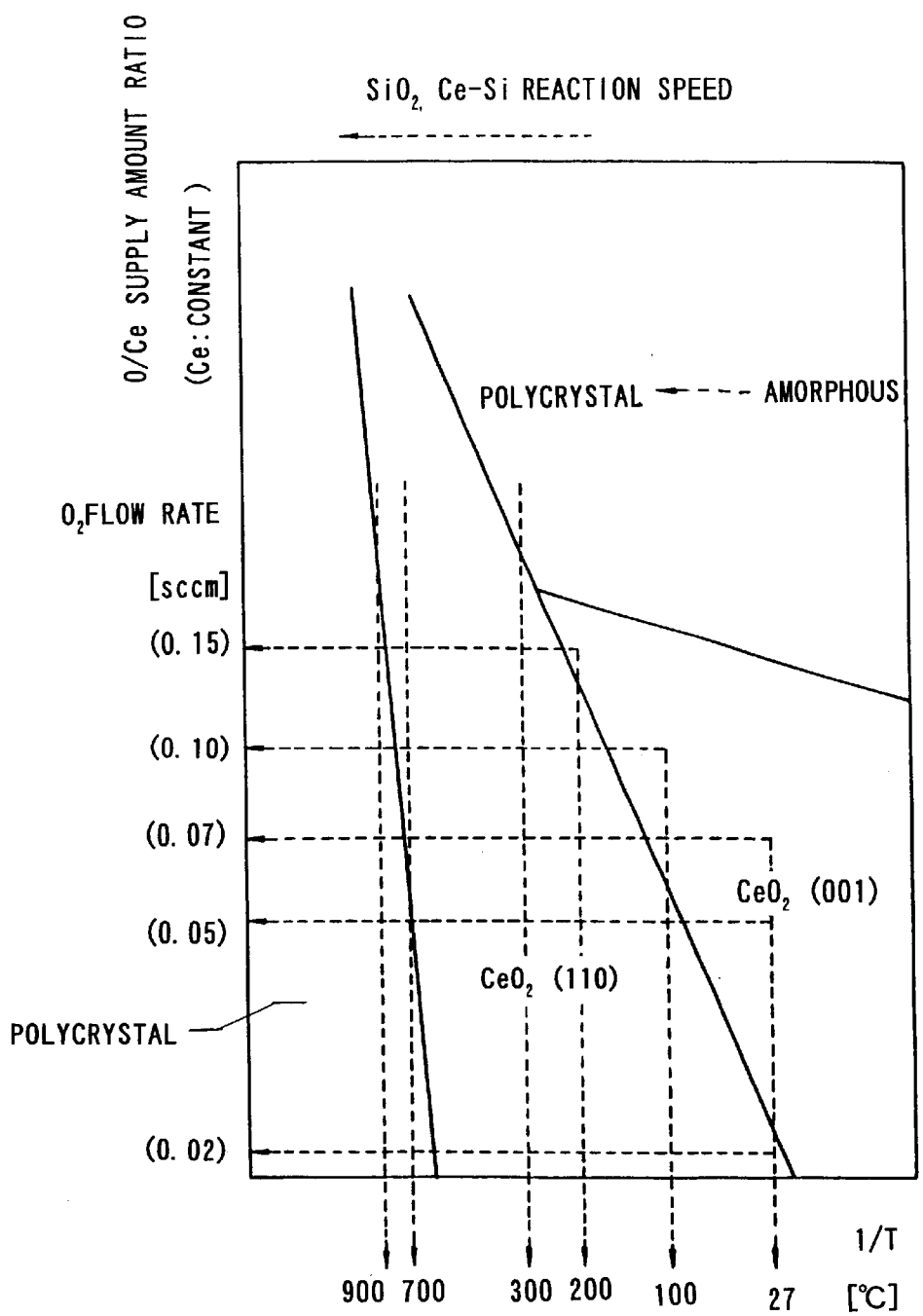
FIG. 1 is a diagram for explaining relationship between crystal orientations obtained when growing $CeO_2$ on a (001) Si substrate and growth conditions.
Figure 2:
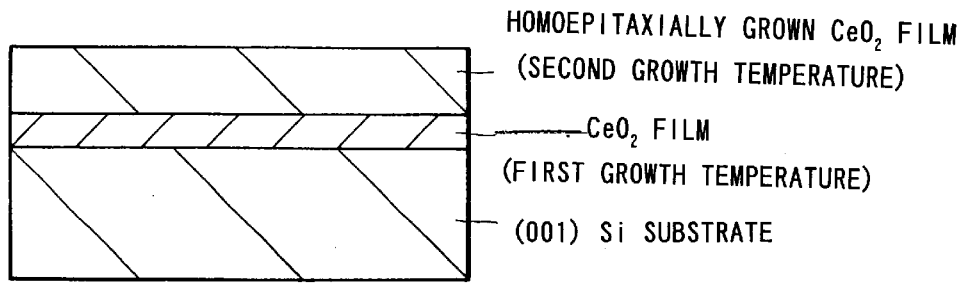
FIG. 2 is a diagram showing an example of epitaxial structure formed on a (001) Si substrate.
Figure 3:
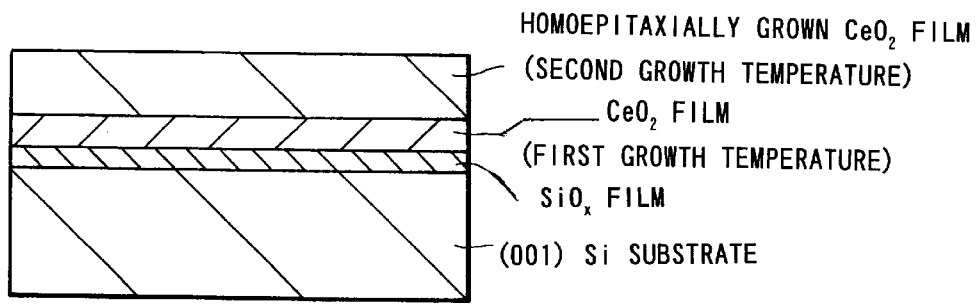
FIG. 3 is a diagram showing an example of epitaxial structure formed on a (001) Si substrate.
Figure 4:
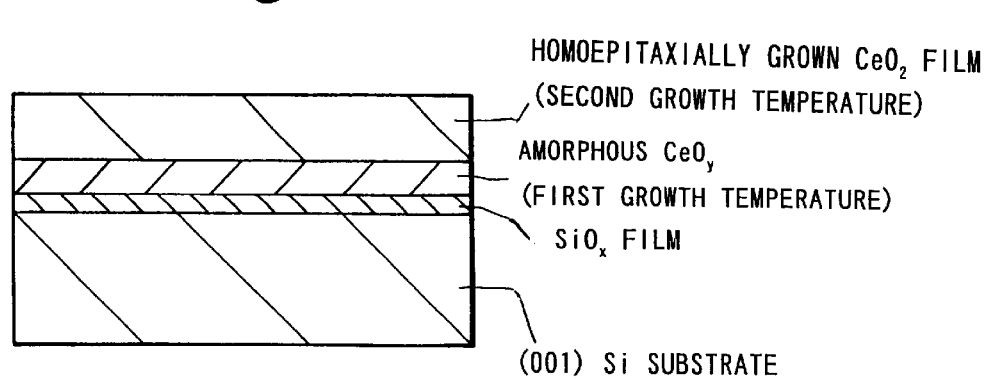
FIG. 4 is a diagram showing an example of epitaxial structure formed on a (001) Si substrate.

Explained below are embodiments of the invention with reference to the drawings. In all of the drawings illustrating embodiments, the same or equivalent parts are labeled with common reference numerals.

First explained is a MBE apparatus used for growing $CeO_2$ in the embodiments explained below. Although it is not impossible to use here a MBE apparatus designed for growth of typical semiconductors, it is preferable that a nozzle, pipe and other members are provided to enable introduction of oxidic gas, preferably oxygen gas into the growth chamber, and the growth chamber, heater, cell and other members must be made of materials resistant to oxidation. Additionally, high-energy electron beams can be directed at an angle within several degrees relative to the substrate surface to enable the surface condition of the substrate to be monitored and a screen coated by a fluorescent material is provided so that the electron beam diffraction image can be observed (RHEED system). The substrate susceptor is made of silicon carbide (SiC) to be heated from the bottom surface by a SiC heater. Three Knudsen cells for generation of molecular beams and two electron beam (EB) guns for electron beam evaporation are provided for the purpose of supplying the source materials. An oxidic gas is supplied to the proximity of the substrate by a nozzle and blown onto the substrate after a flow control by a mass flow controller.

A crystalline growth method of an oxide according to the first embodiment of the invention is explained below.

Figure 5A:
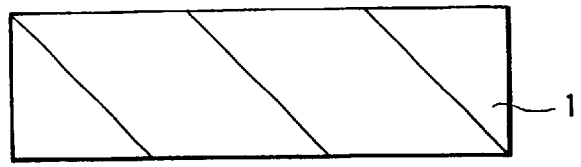
FIGS. 5A through 5C are cross-sectional views for explaining a crystalline growth method of an oxide according to the first embodiment of the invention.

In the first embodiment, first prepared is a (100)-oriented Si substrate 1 as shown in FIG. 5A.

Figure 5B:
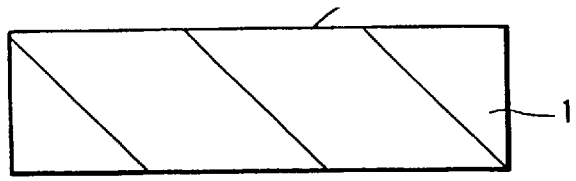

The (100) Si substrate 1 next undergoes surface treatment. This surface treatment is conducted by using the above-introduced method proposed by Ishizaka, Shiraki et al. or other equivalent method so as to form a volatile $SiO_2$ film on the surface and expose the surface by annealing. More specifically, by conducting RCA cleaning of the Si substrate 1 and then repeating several times treatment thereof in concentrated nitric acid boiled to 120 through 130° C. for 10 minutes (etching of the substrate surface and formation of the $SiO_2$ film) and treatment thereof by 2.5% dilute hydrofluoric acid for approximately 10 through 15 seconds (removal of the $SiO_2$ film) to thereby form an even surface. After that, by introducing it into aqueous perammonia ($NH_4OH:H_2O_2:H_2O=1:1:3$) heated to 90° C., a thin $SiO_2$ film is formed on the surface of the Si substrate 1 (for 10 minutes), and it is processed for about 10 to 15 seconds by 2.5% dilute hydrofluoric acid (removal of the $SiO_2$ film). Then, it is introduced again into aqueous perammonia ($NH_4OH:H_2O_2:H_2O=1:1.25:3$) heated to 90° C. to form a thin $SiO_2$ film (for 10 minutes), then rinsed with ultrapure water having a specific resistance not less than 18 MΩcm, followed by removal of water drops from the substrate surface by nitrogen gas, and thereafter introduced into the growth chamber of the MBE apparatus. In the growth chamber, after it is degassed in vacuum at 600° C. for one hour, it is heated to 1000° C. and held at the temperature for several seconds to vaporize SiO from the surface of the Si substrate 1 ($Si+SiO_2 \rightarrow 2SiO\uparrow$). In this process, at the moment where it is heated to about 850° C., the 2×1, 1×2 reconstructed surface is obtained (FIG. 5B). The Si substrate 1 having formed the dimer structure by 2×1, 1×2 surface reconstruction is cooled to the growth temperature and used as the substrate for growth of $CeO_2$. It should be noted that in the experiments by the Inventors, island structures probably made of SiC which are usually contamination could not be removed completely because SiC is used as the heater and susceptor.

Figure 5C:
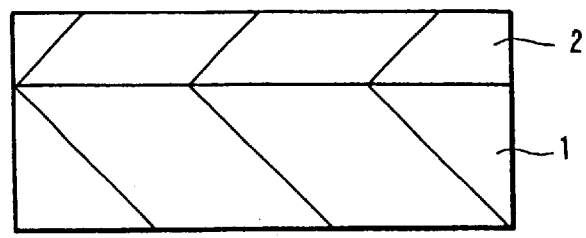
Figure 6:
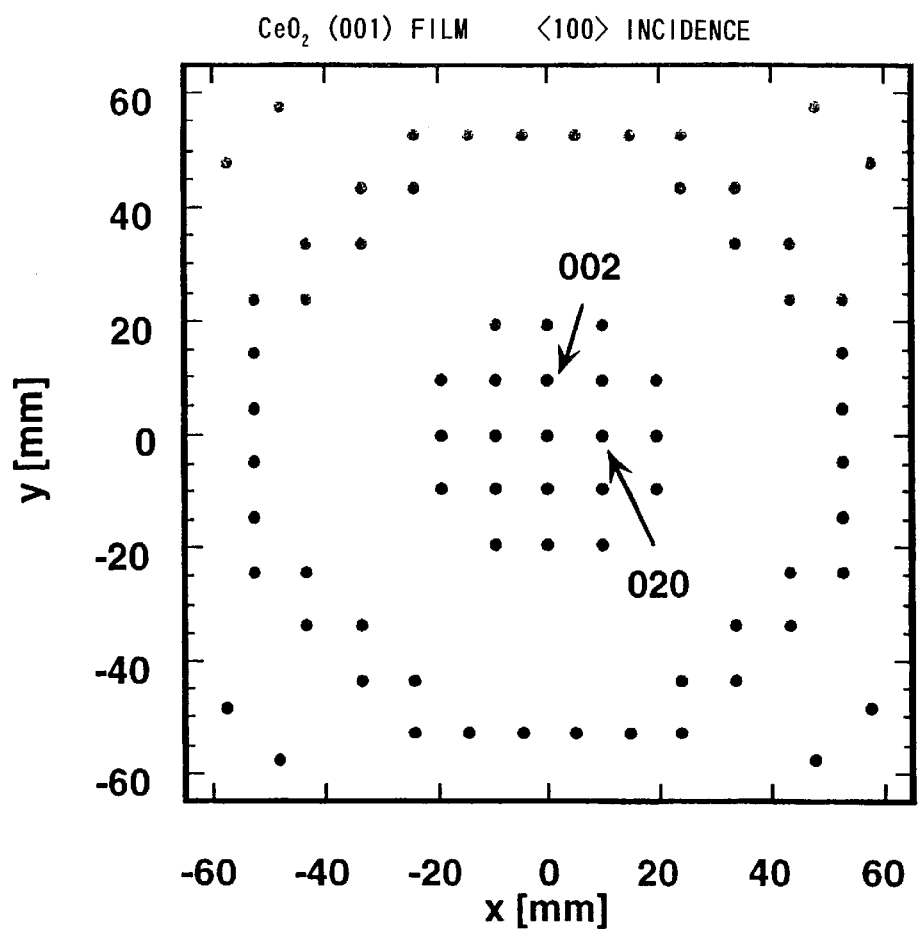
FIG. 6 is a diagram showing a simulation pattern of positions of electron beam diffraction by <100> incidence of a (001) $CeO_2$ film grown in the first embodiment of the invention.
Figure 7:
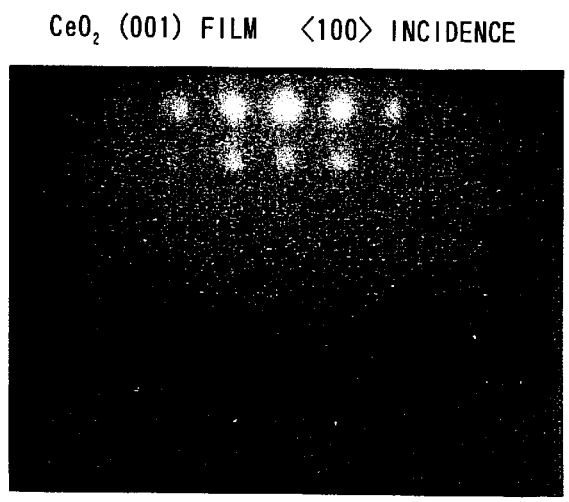
FIG. 7 is a diagram showing a RHEED pattern actually obtained by <100> incidence of a (001) $CeO_2$ film grown in the first embodiment of the invention.
Figure 8:
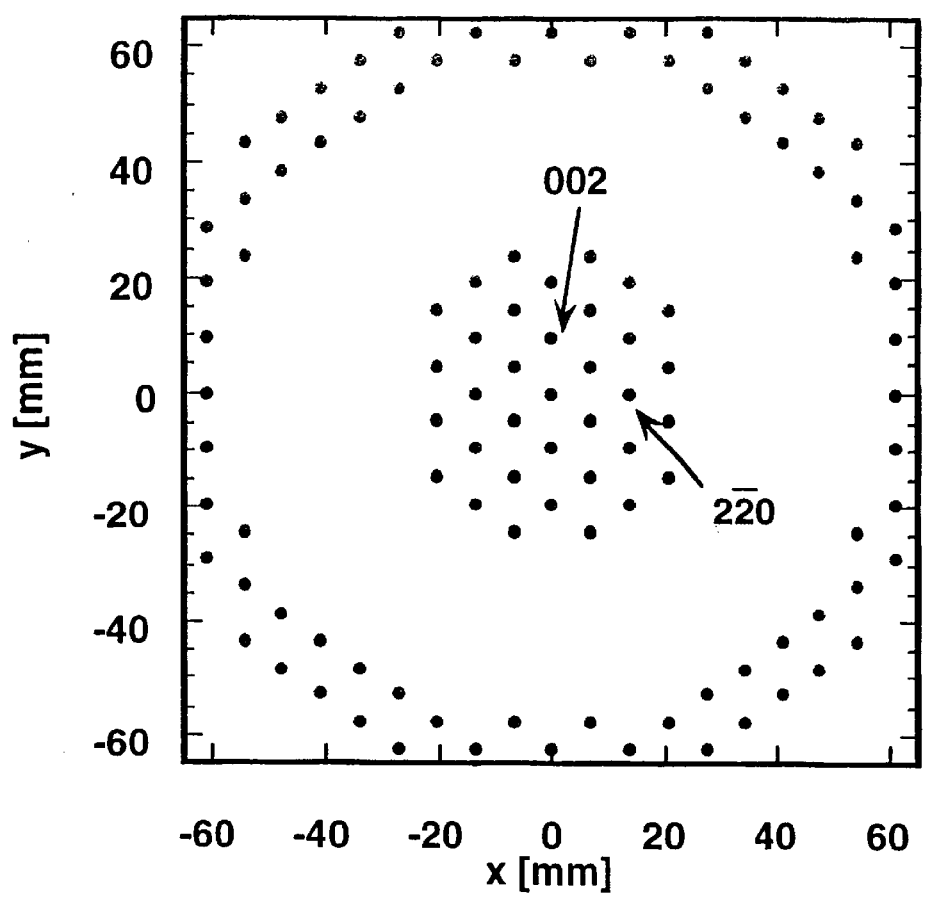
FIG. 8 is a diagram showing a simulation pattern of positions of electron beam diffraction by <110> incidence of a (001) $CeO_2$ film grown in the first embodiment of the invention.
Figure 9:
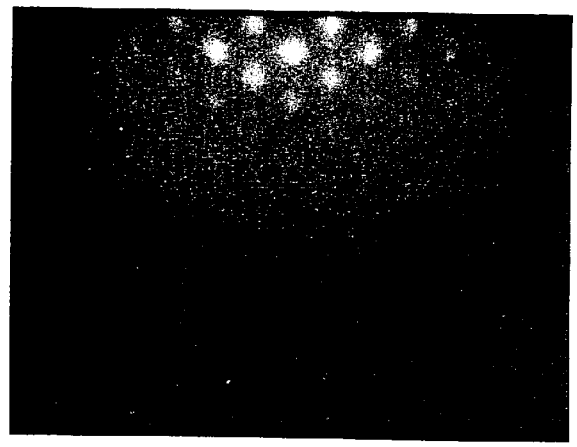
FIG. 9 is a diagram showing a RHEED pattern obtained by <110> incidence of a (001) $CeO_2$ film grown in the first embodiment of the invention.
Figure 10:
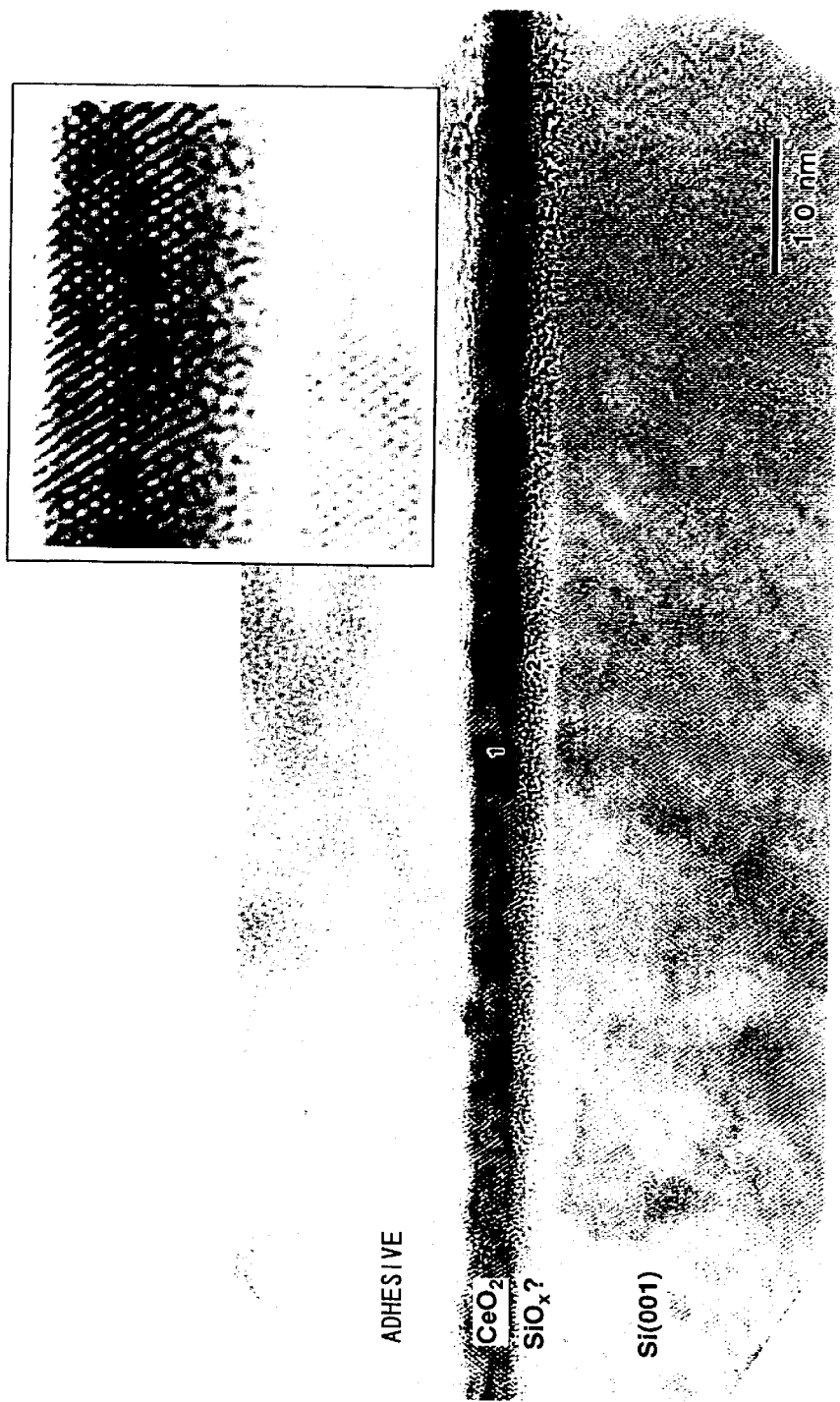
FIG. 10 shows a cross-sectional lattice image by transmission electron microscopy of a sample obtained by the first embodiment of the invention.

After that, as shown in FIG. 5C, by using cerium metal and oxygen as source materials and supplying them at appropriate rates (see FIG. 1) onto the Si substrate 1 having formed the dimer structure by 2×1, 1×2 surface reconstruction at a low substrate temperature not higher than 100° C., the (001)-oriented $CeO_2$ film 2 is epitaxially grown. More specifically, setting the substrate temperature at 27° C., for example, EB gun current to 150 mA and flow rate of oxygen to 0.05 sccm, cerium metal and oxygen are supplied into the growth chamber. What is important here is to supply cerium metal after starting the supply of oxygen onto the surface of the Si substrate 1. When the growth is conducted in this manner, it is confirmed on a RHEED screen that $CeO_2$ (001) is epitaxially growing. FIGS. 6 and 7 show a simulation pattern of positions of electron beam diffraction of the (001) $CeO_2$ film and a RHEED pattern actually obtained by <100> incidence. FIGS. 8 and 9 show a simulation pattern of positions of electron beam diffraction of (001) $CeO_2$ film and a RHEED pattern actually obtained by <110> incidence. When the $CeO_2$ film 2 was grown to a thickness not less than approximately 5 nm under the above-explained conditions, orientation tended to degrade as the thickness of the film increased. FIG. 10 shows an example of cross-sectional lattice image (<110> incidence) by transmission electron microscopy of the $CeO_2(001)/Si(001)$ structure obtained in this manner. It is known from FIG. 10 that, although a defective layer (considered to be a $SiO_x$ film) with a thickness around 2 nm exists along the interface between the Si substrate 1 and the $CeO_2$ film 2, lattice fringes of the $CeO_2$ film 2 are aligned with those of the Si substrate 1, this evidences epitaxial growth of the $CeO_2$ film 2.

As explained above, according to the first embodiment, since the surface of the (001) Si substrate 1 is first processed into a dimer structure by 2×1, 1×2 surface reconstruction, cerium metal and oxygen are thereafter supplied to the growth chamber at appropriate rates, by starting the supply of oxygen earlier, and thereby progressing growth at a low substrate temperature not higher than approximately 100° C. the $CeO_2$ film 2 can be epitaxially grown well in the (001) orientation.

Next explained is a crystal growth method of an oxide according to the second embodiment of the invention.

Figure 11A:
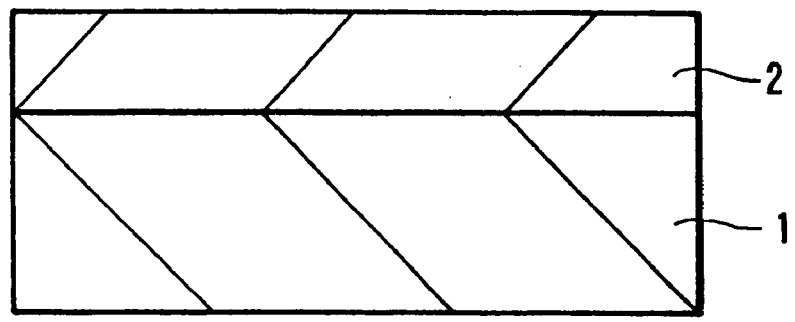
FIGS. 11A and 11B are cross-sectional views for explaining a crystal growth method of an oxide according to the second embodiment of the invention.

In the second embodiment, the (001) $CeO_2$ film 2 is first grown epitaxially on the (001) Si substrate 1 having formed on its surface a dimer structure by 2×1, 1×2 surface reconstruction in the same manner as the first embodiment, as shown in FIG. 11A. Thickness of the $CeO_2$ film 2 is 5 nm, for example.

Figure 11B:
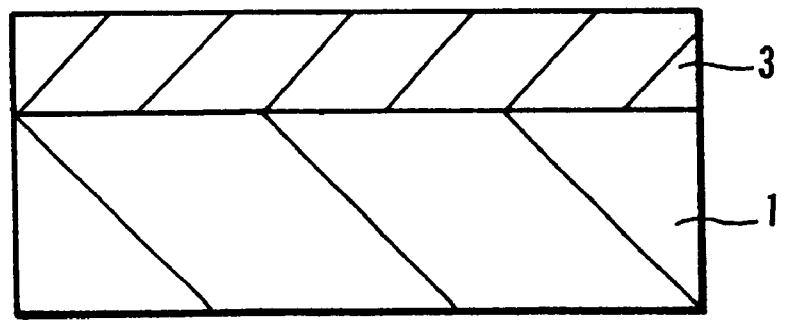
Figure 12:
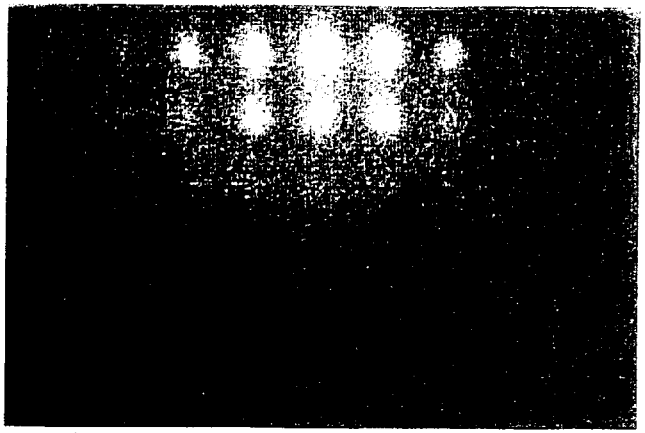
FIG. 12 is a diagram showing a RHEED pattern immediately after the growth of a (001) $CeO_2$ film grown in the second embodiment of the invention.
Figure 13:
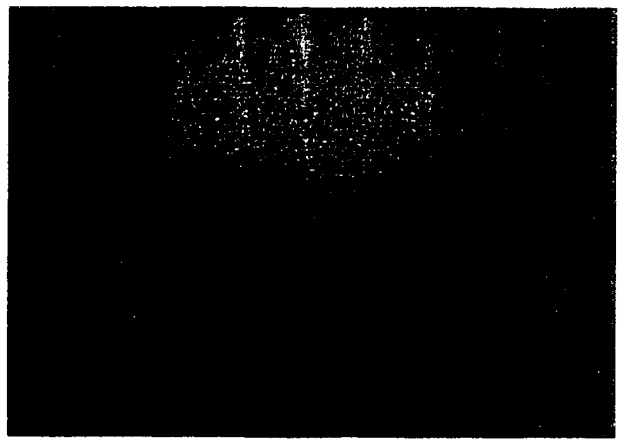
FIG. 13 is a diagram showing a RHEED pattern obtained by <100> incidence after growing a (001) $CeO_2$ film and annealing it in vacuum at 300° C. in the second embodiment of the invention.
Figure 14:
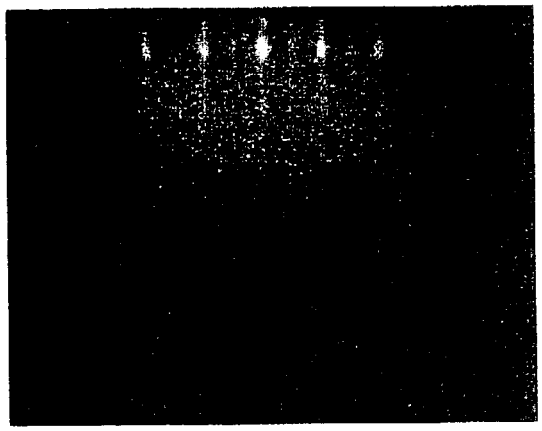
FIG. 14 is a diagram showing a RHEED pattern obtained by <100> incidence after growing a (001) $CeO_2$ film and annealing it in vacuum at 600° C. in the second embodiment of the invention.
Figure 15:
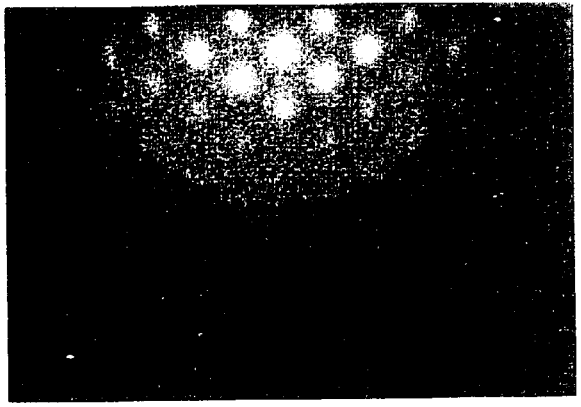
FIG. 15 is a diagram showing a RHEED pattern by <110> incidence immediately after the growth of a (001) $CeO_2$ film grown in the second embodiment of the invention.
Figure 16:
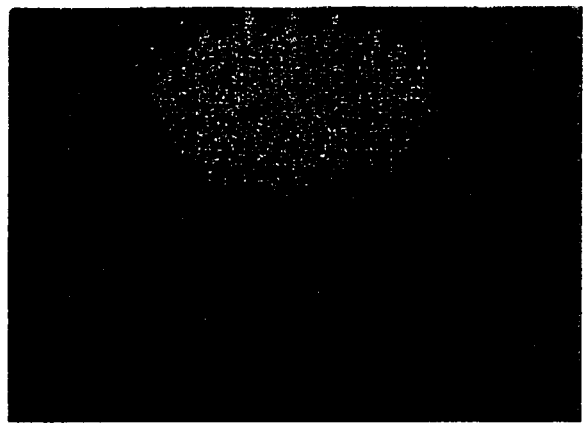
FIG. 16 is a diagram showing a RHEED pattern obtained by <110> incidence after growing a (001) $CeO_2$ film and annealing it in vacuum at 300° C. in the second embodiment of the invention.
Figure 17:
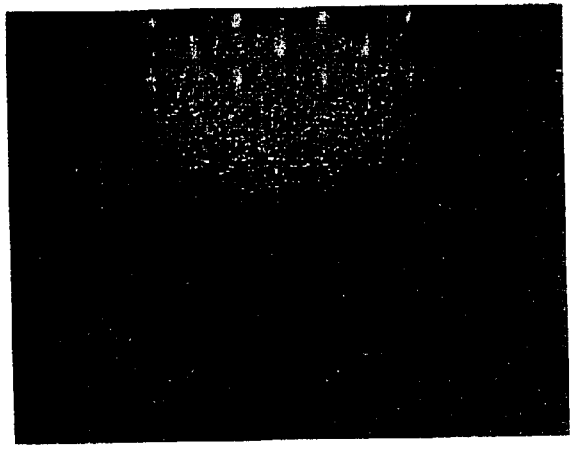
FIG. 17 is a diagram showing a RHEED pattern obtained by <110> incidence after growing a (001) $CeO_2$ film and annealing it in vacuum at 600° C. in the second embodiment of the invention.
Figure 18:
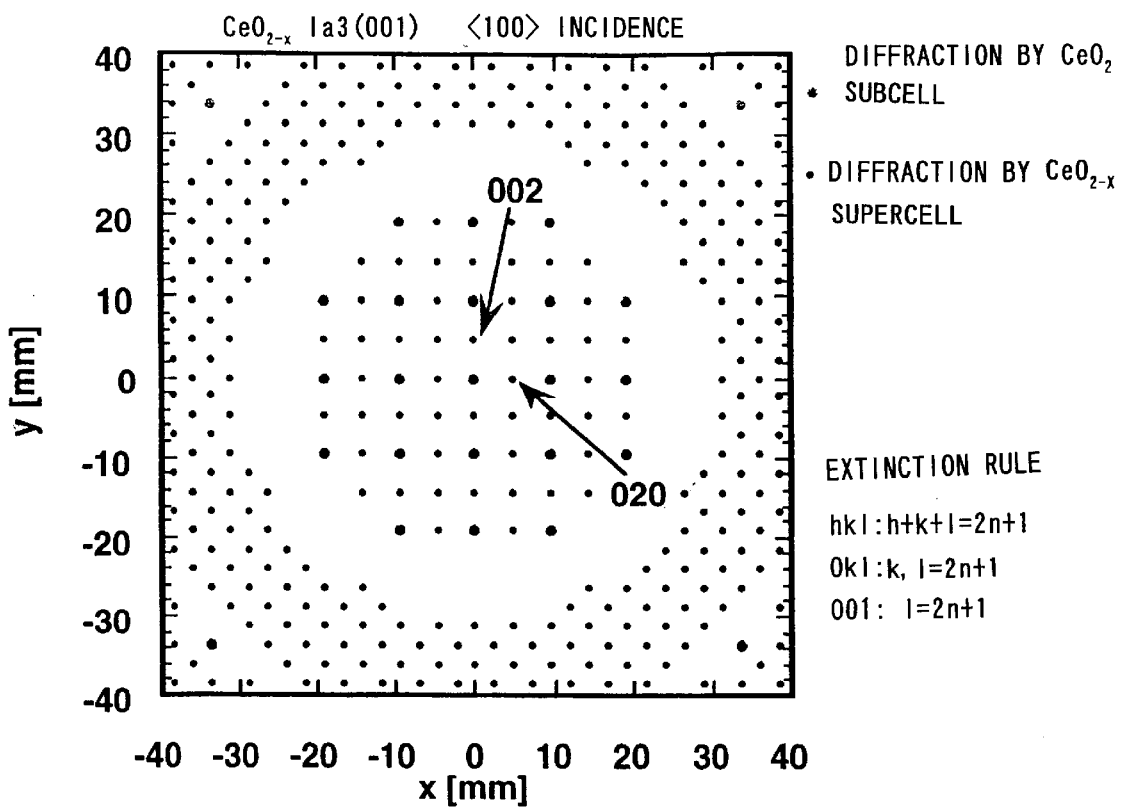
FIG. 18 is a diagram showing a simulation pattern of positions of electron beam diffraction by <100> incidence of a (001) $CeO_{2-x}$ film obtained after annealing in vacuum in the second embodiment of the invention.
Figure 19:
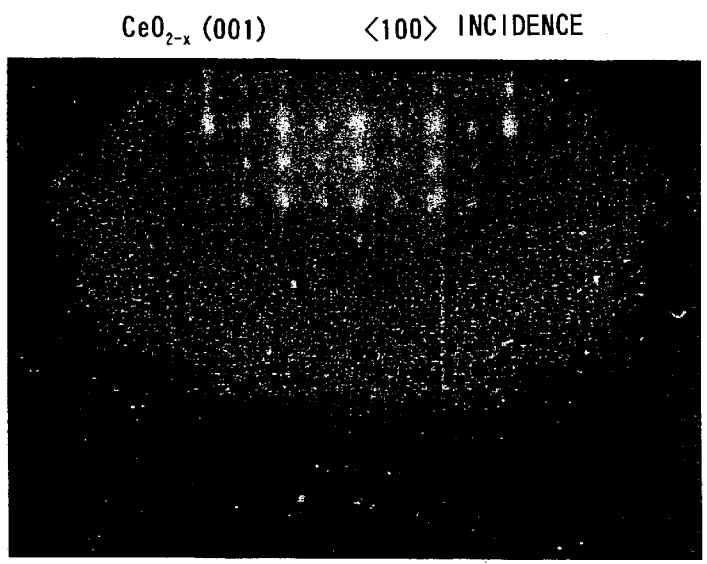
FIG. 19 is a diagram showing a RHEED pattern obtained by <100> incidence of a (001) $CeO_{2-x}$ film obtained after annealing in vacuum in the second embodiment of the invention.
Figure 20:
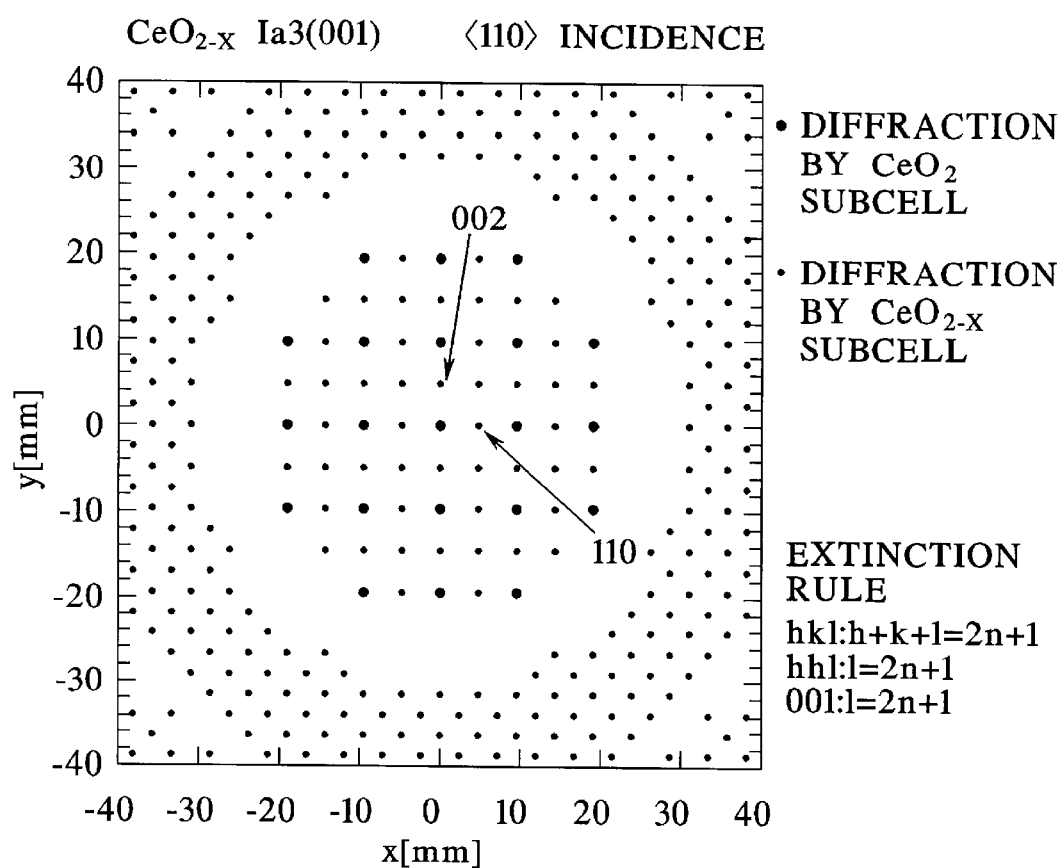
FIG. 20 is a diagram showing a simulation pattern of positions of electron beam diffraction by <110> incidence of a (001) $CeO_{2-x}$ film obtained after annealing in vacuum in the second embodiment of the invention.
Figure 21:
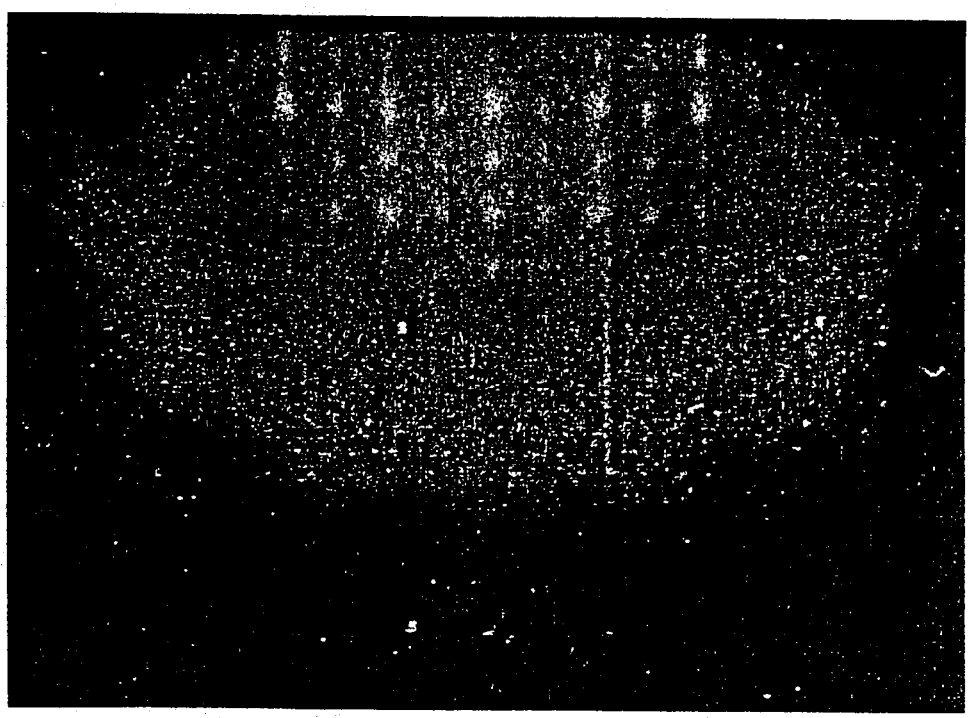
FIG. 21 is a diagram showing a RHEED pattern obtained by <110> incidence of a (001) $CeO_{2-x}$ film obtained after annealing in vacuum in the second embodiment of the invention.

After that, in the growth chamber of the MBE apparatus, the $CeO_2$ film 2 is annealed in vacuum (for example, on the order of $10^{-9}$ Torr). FIGS. 12 through 17 show changes of the RHEED pattern by annealing in vacuum. FIGS. 12 through 14 show those by <100> incidence, among which FIG. 12 is a RHEED pattern appearing just after the growth at a room temperature, FIG. 13 is a RHEED pattern appearing when the annealing temperature is 300° C., and FIG. 14 is a RHEED pattern appearing when the annealing temperature is 600° C. FIGS. 15 through 17 show those by <110> incidence, in which FIG. 15 is a RHEED pattern appearing just after the growth at a room temperature, FIG. 16 is a RHEED pattern appearing when the annealing temperature is 300° C., and FIG. 17 is a RHEED pattern appearing when the annealing temperature is 600° C. It is confirmed from FIGS. 12 through 17 that the film is once smoothed by annealing in vacuum at 300° C. approximately, and superlattice spots appear as a result of annealing in vacuum at a temperature not lower than 500° C. approximately. By heating it to 900° C. and thereafter cooling it to the room temperature, a (001) $CeO_{2-x}$ film 3 of a bixbyite phase is obtained as shown in FIG. 11B. A RHEED pattern by <100> incidence of this sample is shown in FIG. 19, and a simulation pattern of positions of electron beam diffraction by <100> incidence of the $CeO_{2-x}$ (001) film is shown in FIG. 18. Further, a RHEED pattern by <110> incidence of the same sample is shown in FIG. 21, and a simulation pattern of positions of electron beam diffraction by <110> incidence of the bixbyite-phase $CeO_{2-x}$ (001) film is shown in FIG. 20. According to consideration of the extinction rule, the space group is determined to be Ia3(206) (FIGS. 18 and 20). This is considered to be oxygen-defective phase $CeO_2$ of the same structure as $Y_2O_3$ ((51) JCPDS: 23–1048, 44–1086). This bixbyite phase is assumed to be nonstoichiometric to the amount of oxygen, and it is a new material which is stable only in high vacuum. Under an oxygen pressure not lower than $10^{-7}$ Torr, superlattice patterns tended to disappear.

As explained above, according to the second embodiment, the bixbyite-phase (001) $CeO_{2-x}$ film 3 can be obtained by first growing (001) $CeO_2$ film 2 on the (001) Si substrate 1 having formed a dimer structure on its surface by 2×1, 1×2 surface reconstruction in the same manner as the first embodiment, and thereafter conducting annealing in vacuum.

Next explained is a crystal growth method of an oxide according to the third embodiment of the invention.

Figure 22A:
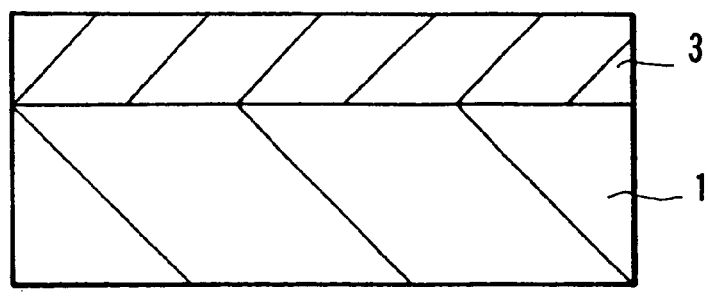
FIGS. 22A and 22B are cross-sectional views for explaining a crystal growth method of an oxide according to the third embodiment of the invention.

In the third embodiment, in the same manner as the second embodiment, the bixbyite-phase (001) $CeO_{2-x}$ film 3 is formed on the (001) Si substrate 1 as shown in FIG. 22A. The $CeO_{2-x}$ film 3 used here need not have stoichiometry such as $Ce_2O_3$.

Figure 22B:
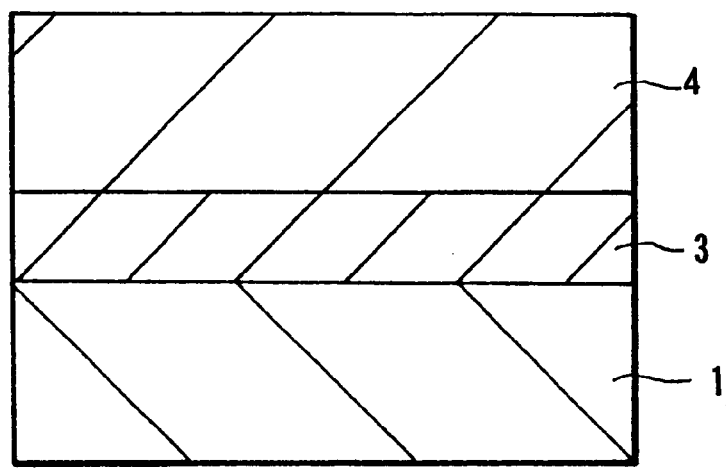
Figure 23:
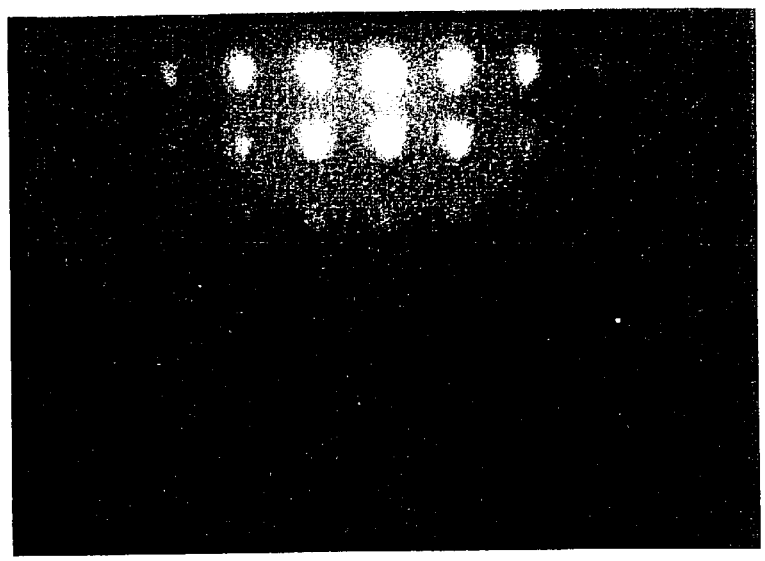
FIG. 23 is a RHEED pattern obtained by <100> incidence of a (001) $CeO_2$ film homoepitaxially grown in the third embodiment of the invention.
Figure 24:
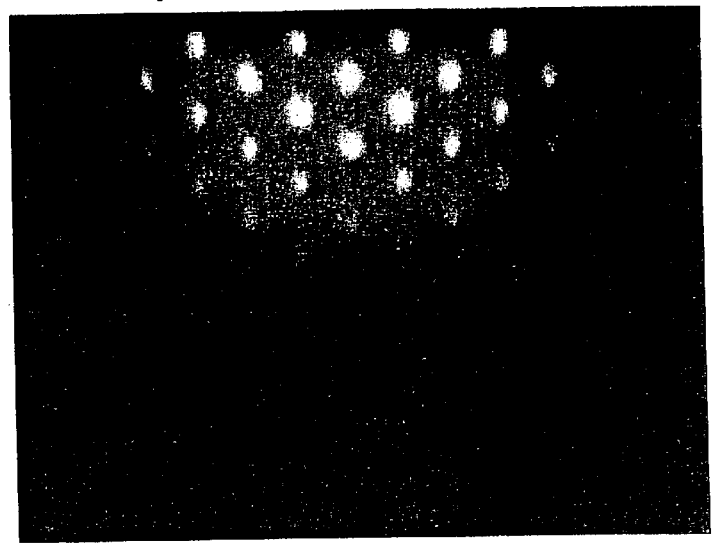
FIG. 24 is a RHEED pattern obtained by <110> incidence of a (001) $CeO_2$ film (001) $CeO_2$ film homoepitaxially grown in the third embodiment of the invention.

After that, as shown in FIG. 22B, a $CeO_2$ film 4 is homoepitaxially grown in the (001) orientation on the $CeO_{2-x}$ film 3. The growth of the $CeO_2$ film 4 is conducted under the conditions of, for example, 700° C. as the substrate temperature, 150 mA as the EB gun current, and 0.25 sccm as the flow rate of oxygen. Thickness of the $CeO_2$ film 4 may be, for example, 45 nm. RHEED patterns of the $CeO_2$ film 4 homoepitaxially grown in this manner are shown in FIGS. 23 and 24. FIG. 23 is that by <100> incidence, and FIG. 24 is that by <110> incidence. Under the conditions employed in the first embodiment, it was difficult to grow the $CeO_2$ film to the thickness not less than 5 nm approximately. In the third embodiment, however, by homoepitaxially growing it, the $CeO_2$ film 4 can be grown thick at the substrate temperature as high as 700° C. In this case, the base layer of the homoepitaxial growth may be of a phase in which no superlattice pattern is recognized under an oxygen pressure not lower than 10 Torr. However, in order to maximize the flatness of the surface and reduce diffusion oxygen to the $CeO_2/Si$ interface, it would be preferable to insert the step of forming a bixbyite-phase $CeO_{2-x}$ film 3 as explained with the second embodiment.

Figure 25:
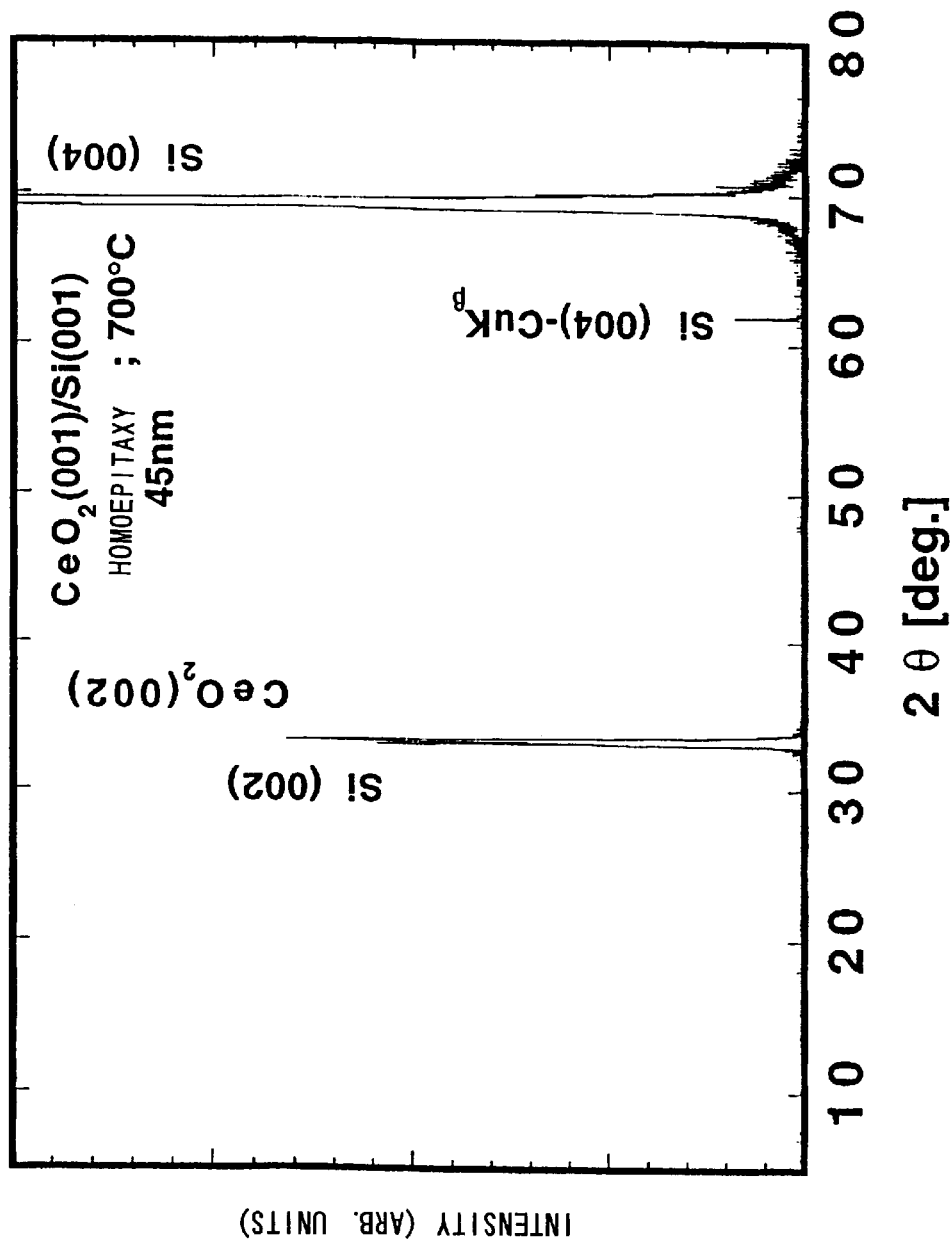
FIG. 25 is a diagram showing an X-ray diffraction pattern of a (001) $CeO_2$ film homoepitaxially grown in the third embodiment of the invention.

The epitaxial $CeO_2$ film 2 in the first embodiment is thin and analysis by X rays was difficult. The homoepitaxial $CeO_2$ film 4, however, is sufficient thick, and can be analyzed by X rays. FIG. 25 shows a result of measurement of X-ray diffraction pattern by θ/2θ scan of $CeO_2(001)/Si(001)$ including the (001) $CeO_2$ film homoepitaxially grown at the substrate temperature of 700° C. on the $CeO_{2-x}$ film grown at the room temperature. The diffractometer used has measuring axes for inclination α and rotation within the plane β in addition to θ/2θ, and axial set-up, φ-scan measurement, and so forth, can be conducted. The X-ray source is CuKα ray.

In the X-ray diffraction pattern shown in FIG. 25, the diffraction peak from the Si substrate 1 overlaps very closely to the $CeO_2$ (002) peak, reflecting the excellent lattice matching. In this example, the diffraction peak from the Si substrate is depicted as Si(002) for convenience. This is forbidden reflection in Si crystal having a diamond structure (space group: Fd3 m). There are various opinions on interpretation of the diffraction peak. However, because of its unique dependency on angle of rotation within the plane, it is considered that at least its major component must be double diffraction by combination such as (111), (−1−11), or the like ((52) Materia Vol. 37 No. 5, p.421(1998)). Therefore, even if the axial set-up is conducted by the Si (004) peak as usually done, the strength of Si (002) is not reproducible in most cases. On the other hand, since a background component is also recognized because of its dependency on angle of rotation within the plane, symmetry degrades due to the crystallographic imperfection, crystallographically imperfect surface and interface, and so on, and a component evaluation as a diffraction peak may exist. Crystallographic characterization was conducted here by conducting the axial set-up to maximize the intensity of symmetric reflection of Si (004) after setting the sample at the angle of rotation within the place where the Si (002) peak appeared.

Figure 26:
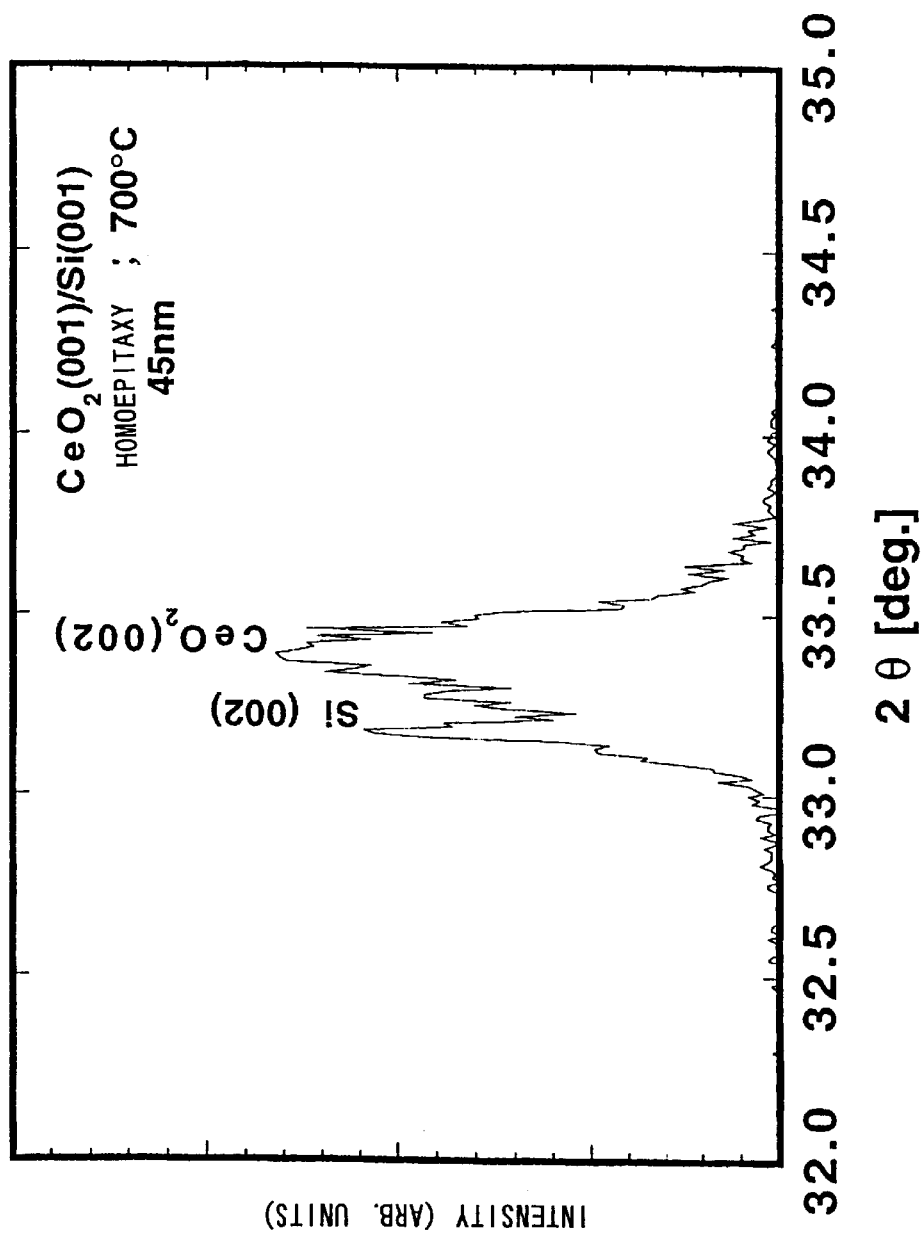
FIG. 26 is a diagram showing a part of the X-ray diffraction pattern shown in FIG. 25 in an enlarged scale.
Figure 27:
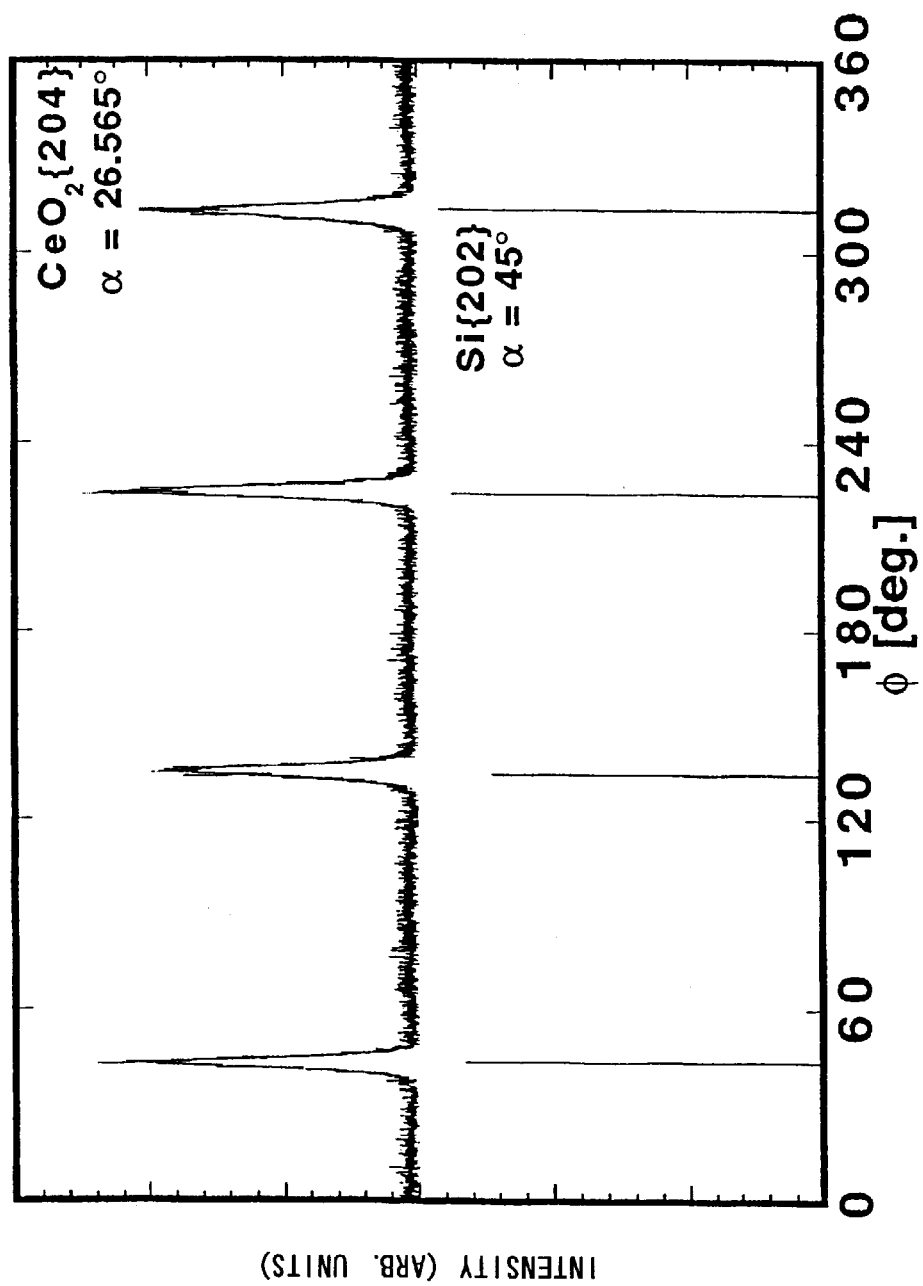
FIG. 27 is a diagram showing φ scan data of $CeO_2$ {204} and substrate Si {202} peak of a sample which includes a (001) $CeO_2$ film homoepitaxially grown in the third embodiment of the invention.

Data of the X-ray diffraction pattern shown in FIG. 25 is the result of evaluation of a 10×10 mm region of the sample near the tip of the nozzle because the nozzle for introducing oxidic gas is located immediately near the substrate and there is a certain profile in concentration of oxygen supplied during the growth of the $CeO_2$ film. In this region, almost no diffraction like $CeO_2$ (111), (220), etc. is recognized, and this shows that single-phase $CeO_2$ (001) has been formed. FIG. 26 shows the portion near the Si (002) and $CeO_2$ (002) peaks of FIG. 25 in an enlarged scale. In FIG. 26, although overlap of peaks is difficult to prevent, the $CeO_2$ (002) peak is clearly noted. The lattice constant is slightly smaller than the bulk value (~5.411 Å) and approximately ~5.392 Å.

φ-scan data of the $CeO_2$ {204} peak and the substrate Si {202} peak of the sample in FIGS. 25 and 26 are shown in FIG. 27. It can be confirmed from FIG. 27 that the family of $CeO_2$ {204} reflections and that of Si {204} are in alignment and crystal axes of $CeO_2$ and Si overlap by cube-on-cube configuration in the macroscopic region. Also from this result, epitaxial growth of the $CeO_2$ film 4 is confirmed.

Figure 28:
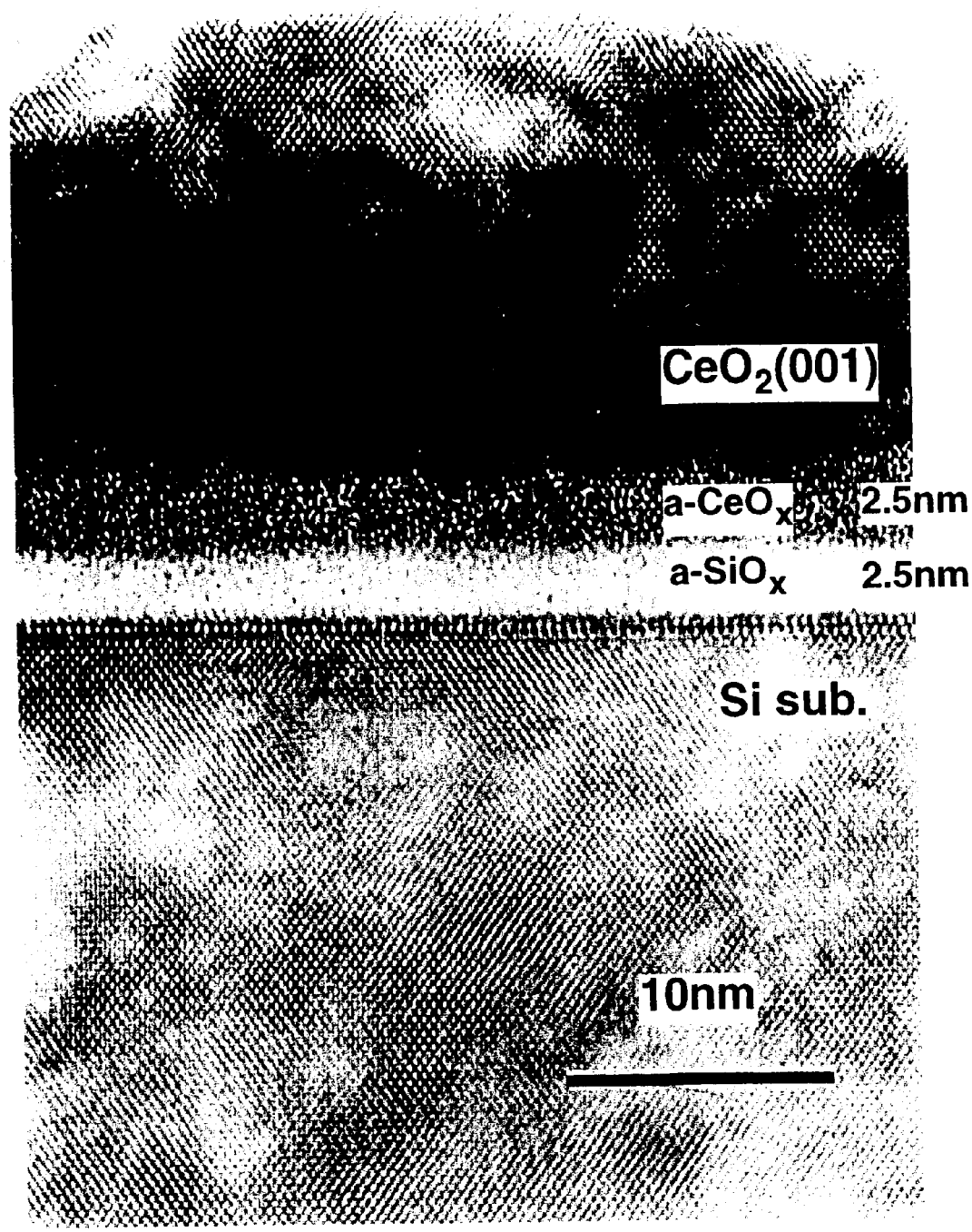
FIG. 28 is a cross-sectional lattice image by transmission electron microscopy of a sample obtained by the third embodiment of the invention.

FIG. 28 shows an example of cross-sectional lattice image by transmission electron microscopy of a sample in which the $CeO_{2-x}$ film 3 was first grown on the (001) Si substrate 1 at the room temperature and the $CeO_2$ film 4 was thereafter grown thick homoepitaxially in the (001) orientation on the $CeO_{2-x}$ film 3 at 700° C. In FIG. 28, the $CeO_{2-x}$ film 3 is depicted as $CeO_x$, and since this $CeO_x$, is amorphous, it is depicted as a-$CeO_x$. It is known from FIG. 28 that, although a 2.5 nm thick a-$CeO_x$ exists along the interface between the Si substrate 1 and the $CeO_2$ film 4, lattice fringes of the $CeO_2$ film 4 align with those of Si substrate 1, and this evidences that the $CeO_2$ film 4 was epitaxially grown.

As explained above, according to the third embodiment, by first forming the bixbyite-phase (001) $CeO_{2-x}$ film 3 on the (001) Si substrate 1 in the same manner as the second embodiment and thereafter homoepitaxially growing the $CeO_2$ film 4 in the (001) orientation on the $CeO_{2-x}$ film 3, the epitaxial (001) $CeO_2$ film 4 having a sufficient thickness can be obtained.

Figure 29:
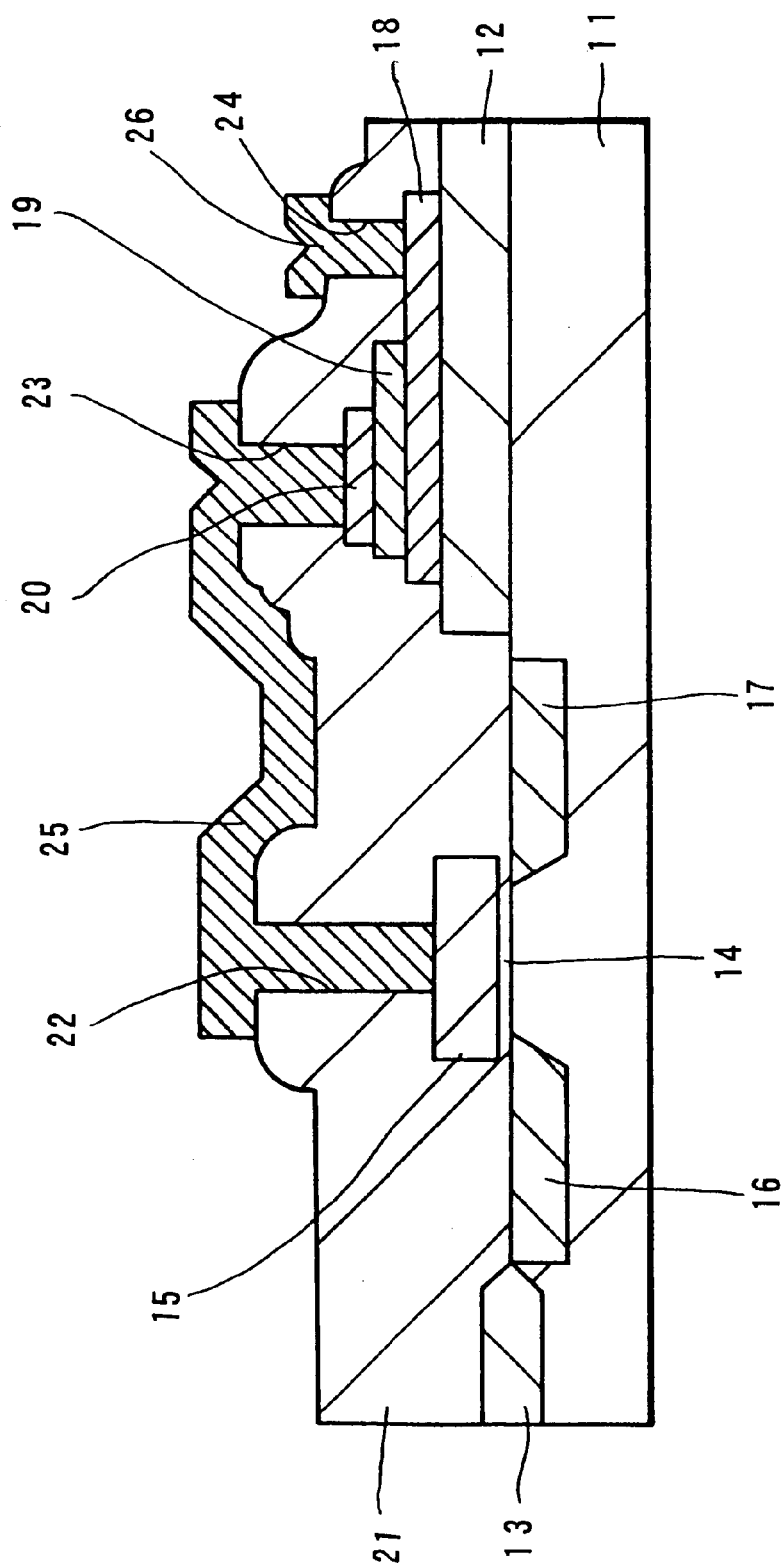
FIG. 29 is a cross-sectional view for explaining a manufacturing method of a ferroelectric non-volatile memory according to the fourth embodiment of the invention.

Next explained is a manufacturing method of a ferroelectric non-volatile memory according to the fourth embodiment of the invention. This is a ferroelectric non-volatile memory by MIS-FET and ferroelectric capacitor gates (FCG) using a $CeO_2$(001)/Si(001) epitaxial structure. Completed state of this ferroelectric non-volatile memory is shown in FIG. 29.

In the fourth embodiment, an epitaxial (001) $CeO_2$ film 12 is first formed in selective capacitor areas on a (001) Si substrate 11 in the same manner as the first embodiment. To obtain this $CeO_2$ film 12, it may be epitaxially grown selectively by selectively covering the surface of the Si substrate 11 with a growth mask (not shown). Alternatively, after the $CeO_2$ film 12 is epitaxially grown on the entire surface of the Si substrate 11, it may be patterned by ion milling, for example.

To process the structure other than (001)$CeO_2$/(001)Si structure 11, a conventional semiconductor process can be used basically. That is, first made is a field insulating film 13 in form of a $SiO_2$ film by selectively thermally oxidizing the surface of the Si substrate by LOCOS (local oxidation of silicon), for example. After that, a $SiO_2$ film as a gate insulating film 14 is formed by thermal oxidation on the surface of an active region isolated by the field insulating film 13. Then, a polycrystalline Si film is formed on the entire surface by CVD (chemical vapor deposition), for example, and after doping an impurity into the polycrystalline Si film to reduce its resistance, the polycrystalline Si film is etched and patterned to form a gate electrode 15. After that, using this gate electrode 15 as a mask, an impurity is ion-implanted into the Si substrate 1, and if necessary, it is annealed to electrically activate the impurity. As a result, a source region 16 and a drain region 17 are formed in self alignment with the gate electrode 15. As these impurities, an n-type impurity such as arsenic (As) is used in case of making an n-channel MIS-FET whereas a p-type impurity such as boron (B) is used in case of making a p-channel MIS-FET.

After that, a lower electrode 18 made of a conductive oxide such as (001) $SrRuO_3$, ferroelectric film 19 made of (001) PZT, for example, and upper electrode 20 made of a conductive oxide such as (001)$SrRuO_3$ are formed sequentially to form a ferroelectric capacitor. The lower electrode 18 is formed slightly larger than the ferroelectric film 19 and the upper electrode 20 so that wiring can be connected later. These conductive oxides and ferroelectric film can be epitaxially grown by sputtering, CVD, or the like. In this case, they may be grown selectively by using a growth mask, or first grown on the entire surface and thereafter processed by ion milling, for example, by using a $SiO_2$ film as a mask.

Then, after a inter-layer insulating film 21 such as $SiO_2$ film is formed on the entire surface by CVD, for example, and a predetermined portion of the inter-layer insulating film 21 on the gate electrode 15, predetermined portion thereof on the upper electrode 20 and predetermined portion thereof on the lower electrode 18 are removed by etching to form contact holes 22, 23, 24. Then, after an aluminum (Al) film, for example, is formed on the entire surface by vacuum evaporation, sputtering, or the like, for example, the Al film is patterned by etching to form a local wiring 25 connecting the gate electrode 15 and the upper electrode 20, and a local wiring 26 connected to the lower electrode 18.

Through these steps, as shown in FIG. 29, the MFMIS structured ferroelectric non-volatile memory in which the ferroelectric capacitor is connected to the gate electrode 15 of MIS-FET is obtained.

The ferroelectric non-volatile memory according to the fourth embodiment has a lot of advantages as the above-mentioned MFS (MFMIS) structured ferroelectric non-volatile memory. In addition to this, since the highly reliable $SiO_2$ film can be used as the gate insulating film, and the ferroelectric capacitor is formed in separation from MIS-FET, the design choice from the viewpoint of the gate/capacitor areal ratio is large and enables sufficient polarization of the ferroelectric material even under a low voltage by making the ferroelectric capacitor relatively small; and especially, since the ferroelectric film 19 can be made in form of an epitaxial single-crystal thin film, excellent rectangularity is expected, and this is significantly advantageous against retention, disturbance, etc. which are the most serious problems of MFS-structured ferroelectric non-volatile memories. These advantages are the greatest features of the ferroelectric non-volatile memory according to the fourth embodiment. The $CeO_2(001)/Si(001)$ interface is subject to deterioration such as formation of a $SiO_x$ film in a thermal oxidation process, for example. In the structure according to the fourth embodiment, however, only if a conductive oxide such as $SrRuO_3$ is epitaxially grown on the (001) $CeO_2$, interface deterioration, if any, does not cause any problem to device operation, and it is more advantages than conventional MFIS-structured ferroelectric non-volatile memories also from the viewpoint of the process.

Figure 30:
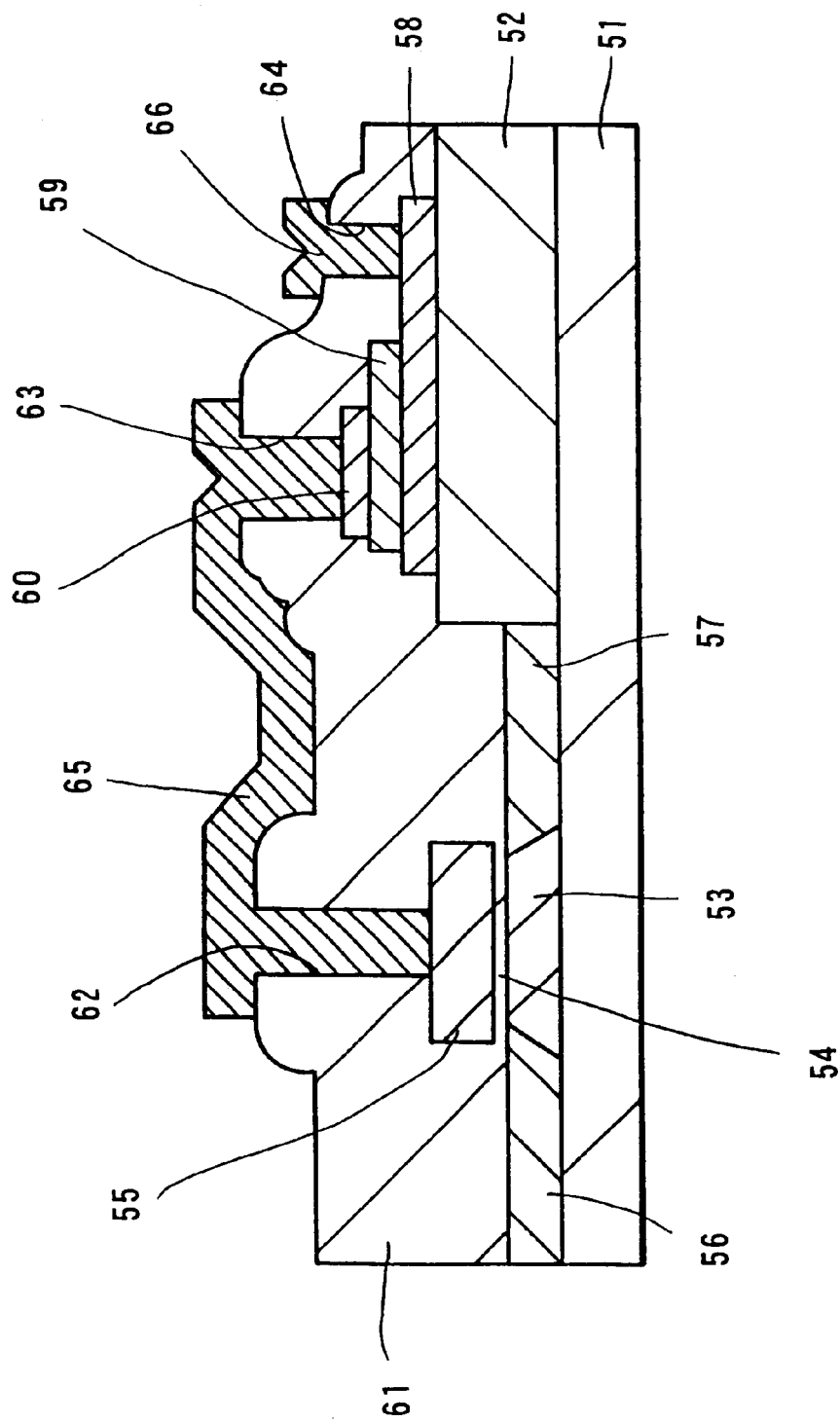
FIG. 30 is a cross-sectional view for explaining a manufacturing method of a ferroelectric non-volatile memory according to the fifth embodiment of the invention.

Next explained is a manufacturing method of a ferroelectric non-volatile memory according to the fifth embodiment of the invention. The ferroelectric As shown in FIG. 30, for manufacturing the ferroelectric non-volatile memory, an epitaxial (001) $CeO_2$ film 52 is first formed on the surface of a capacitor region on a so-called r-plane, i.e. (1–102)-oriented sapphire substrate 51. Formation of the epitaxial (001) $CeO_2$ film 52 on the r-plane sapphire substrate 51 is very easy. After that, a single-crystal Si film 53 as a channel layer is epitaxially grown on the surface of a MIS-FET region on the sapphire substrate 51. Subsequently, after a gate insulating film 44 such as SiO film is formed on the surface of the single-crystal Si film 53, a gate electrode 55 of polycrystalline Si doped with an impurity, for example, is formed. Thereafter, by ion-implanting an impurity into the single-crystal Si film 53 by using the gate electrode 55 as a mask, a source region 56 and a drain region 57 are formed in self alignment with the gate electrode 55. In this manner, MIS-FET having a SOI (silicon-on-insulator) structure is formed. After that, in the same manner as the fourth embodiment, a lower electrode 58 made of a conductive oxide such as (001) $SrRuO_3$, ferroelectric film 59 made of a ferroelectric material such as (001) PZT and upper electrode 60 made of a conductive oxide such as (001) $SrRuO_3$, are formed on the (001) $CeO_2$ film 52. Then, after an inter-layer insulating film 61 such as $Sio_2$ film is formed on the entire surface by CVD, for example, a predetermined portion of the inter-layer insulating film 61 on the gate electrode 55, predetermined portion thereof on the upper electrode 60 and predetermined portion thereof on the lower electrode 58 are removed by etching to form contact holes 62, 63, 64. Subsequently, after an Al film, for example, is formed on the entire surface by vacuum evaporation, sputtering, or the like, the Al film is patterned by etching to form a local wiring 65 connecting the gate electrode 55 and the upper electrode 60, and a local wiring 66 connected to the lower electrode 58.

Through these steps, the MFMIS-structured ferroelectric non-volatile memory is obtained in which all of the single-crystal Si film 53 forming the channel layer of MIS-FET, lower electrode 58, ferroelectric film 59 and upper electrode 60 of the ferroelectric capacitor are epitaxial films and the ferroelectric capacitor is connected to the gate electrode 55 of MIS-FET as shown in FIG. 30.

Through these steps, the MFMIS-structured ferroelectric non-volatile memory is obtained in which all of the single-crystal Si film 53 forming the channel layer of MIS-FET, lower electrode 58, ferroelectric film 59 and upper electrode 66 of the ferroelectric capacitor are epitaxial films and the ferroelectric capacitor is connected to the gate electrode 55 of MIS-FET as shown in FIG. 30.

The ferroelectric non-volatile memory shown in FIG. 30 has the same advantages as those of the ferroelectric non-volatile memory according to the fourth embodiment, and it is further advantageous in preventing short channel effect, reducing parasitic capacitance, reducing the operation voltage, and so on, because MIS-FET has a SOI structure.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, during the growth of the (001) $CeO_2$ film 2, the first embodiment employs the method proposed by Ishizaka, Shiraki, et al. for surface treatment of the Si substrate 1. However, this is not indispensable, and any other appropriate method may be used for this treatment.

As described above, according to the invention, it is possible to epitaxially grow rare-earth oxides like cerium dioxide in the (001) orientation on a (001)-oriented silicon substrate and thereby realize an epitaxial (001) rare-earth oxide/(001) silicon structure. And, by forming a gate insulating film of a field effect transistor and a base layer of the ferroelectric film in a ferroelectric non-volatile memory by using these epitaxial (001) rare earth oxides, field effect transistors and ferroelectric non-volatile memories having excellent properties can be obtained.

What is claimed is:

1. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate; and annealing said rare earth oxide in vacuum with a pressure not higher than $1 \times 10^{-6}$ Torr at a temperature not lower than the growth temperature of said rare earth oxide after said rare earth oxide is epitaxially grown.

2. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate; and homoepitaxially growing another rare earth oxide on said rare earth oxide at a growth temperature higher than the growth temperature of said rare earth oxide after said rare earth oxide is epitaxially grown.

3. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate by using a source material containing at least one kind of rare eartlrelement in an atmosphere containing an oxidic gas; and annealing said rare earth oxide in vacuum with a pressure not higher than $1 \times 10^{-6}$ Torr at a temperature not lower than the growth temperature of said rare earth oxide after said rare earth oxide is epitaxially grown.

4. A crystal growth method of an oxide comprising the steps of:
processing a surface of a (001)-oriented silicon substrate into a dimer structure by 2×1, 1×2 surface reconstruction;
epitaxially growing a rare earth oxide of a cubic system or tetragonal system in the (001) orientation on said silicon substrate by using a source material containing at least one kind of rare earth element in an atmosphere containing an oxidic gas; and
homoepitaxially growing another rare earth oxide on said rare earth oxide at a growth temperature higher than the growth temperature of said rare earth oxide after said rare earth oxide is epitaxially grown.

5. A crystal growth method of an oxide comprising the steps of:
processing a surface of a (001)-oriented silicon substrate into a dimer structure by 2×1, 1×2 surface reconstruction; and
epitaxially growing a rare earth oxide of a cubic system or tetragonal system in the (001) orientation on said silicon substrate by using a source material containing at least one kind of rare earth element in an atmosphere containing an oxidic gas, and said rare earth oxide being epitaxially grown at a growth temperature lower than 300° C.

6. A crystal growth method of an oxide comprising the steps of:
processing a surface of a (001)-oriented silicon substrate into a dimer structure by 2×1, 1×2 surface reconstruction; and
epitaxially growing a rare earth oxide of a cubic system or tetragonal system in the (001) orientation on said silicon substrate by using a source material containing at least one kind of rare earth element in an atmosphere containing an oxidic gas, wherein said rare earth oxide being epitaxially grown at a growth temperature not higher than 100° C.

7. A crystal growth method of an oxide comprising the steps of:
vaporizing a silicon oxide film from the surface of a (001)-oriented silicon substrate by heating it in vacuum with a pressure not higher than $1\times10^{-6}$ Torr; and
epitaxially growing a rare earth oxide of a cubic system or tetragonal system in the (001) orientation on said silicon substrate from which said silicon oxide film is vaporized.

8. The crystal growth method of an oxide according to claim 7 wherein, when said rare earth oxide is epitaxially grown, a source material containing at least one kind of rare earth element is supplied after the supply of an oxidic gas onto the surface of said silicon substrate is started.

9. The crystal growth method of an oxide according to claim 8 wherein said source material containing at least one kind of rare earth element is made up of at least one kind of rare earth element.

10. The crystal growth method of an oxide according to claim 8 wherein said source material containing at least, one kind of rare earth element is made up of a rare earth oxide.

11. The crystal growth method of an oxide according to claim 7 further comprising the step of annealing said rare earth oxide in vacuum with a pressure not higher than $1\times10^{-6}$ Torr at a temperature not lower than the growth temperature of said rare earth oxide after said rare earth oxide is epitaxially grown.

12. The crystal growth method of an oxide according to claim 7 further comprising the step of homoepitaxially growing another rare earth oxide on said rare earth oxide at a growth temperature higher than the growth temperature of said rare earth oxide after said rare earth oxide is epitaxially grown.

13. The crystal growth method of an oxide according to claim 7 further comprising the step of epitaxially growing a functional oxide on said rare earth oxide after said rare earth oxide is epitaxially grown.

14. The crystal growth method of an oxide according to claim 7 wherein a silicon oxide film or a defective layer not thicker than 5 nm is formed along the interface between said silicon substrate and said rare earth oxide.

15. The crystal growth method of an oxide according to claim 7 wherein said functional oxide has a perovskite structure or a layered perovskite structure.

16. The crystal growth method of an oxide according to claim 7 wherein said rare earth oxide is cerium dioxide or yttrium oxide.

17. A manufacturing method of a field effect transistor comprising the steps of:
processing a surface of a (001)-oriented silicon substrate into a dimer structure by 2×1, 1×2 surface reconstruction; and
forming a gate insulating film by epitaxially growing a rare earth oxide of a cubic system or tetragonal system in the (001) orientation on said silicon substrate; wherein,
said gate insulating film is formed by epitaxially growing said rare earth oxide on said silicon substrate at a growth temperature lower than 300° C.

18. The manufacturing method of a field effect transistor according to claim 17 wherein said gate insulating film is formed by epitaxially growing said rare earth oxide on said silicon substrate at a growth temperature lower than 100° C.

19. A manufacturing method of a field effect transistor comprising the steps of:
processing a surface of a (001)-oriented silicon substrate into a dimer structure by 2×1, 1×2 surface reconstruction; and
forming a gate insulating film by epitaxially growing a rare earth oxide of a cubic system or tetragonal system in the (001) orientation on said silicon substrate, wherein,
said surface of the silicon substrate is processed into said dimer structure by heating said silicon substrate in vacuum with a pressure not higher than $1\times10^{-6}$ Torr and thereby vaporizing a silicon oxide film from said surface, and
said gate insulating film is formed by epitaxially growing said rare earth oxide on said silicon substrate.

20. A manufacturing method of a field effect transistor comprising the steps of:
vaporizing a silicon oxide film from a surface of a (001)-oriented silicon substrate by heating said silicon substrate in vacuum with a pressure not higher than $1\times10^{-6}$ Torr;
forming a gate insulating film by epitaxially growing a rare earth oxide of a cubic system or tetragonal system in the (001) orientation on said silicon substrate from which said silicon oxide film is vaporized.

21. A crystal growth method of an oxide comprising the steps of:
processing a surface of a (001)-oriented silicon substrate into a dimmer structure by 2×1, 1×2 surface reconstruction;
epitaxially growing a rare earth oxide of a cubic system or tetragonal system in the (001) orientation on said silicon substrate; and annealing said rare earth oxide in vacuum with a pressure not higher than 1×10⁻⁶ Torr at a temperature not lower than the growth temperature of said rare earth oxide after said rare earth oxide is epitaxially grown.

22. A crystal growth method of an oxide comprising the steps of:

processing a surface of a (001)-oriented silicon substrate into a dimmer structure by 2×1, 1×2 surface reconstruction;

epitaxially growing a rare earth oxide of a cubic system or tetragonal system in the (001) orientation on said silicon substrate; and homoepitaxially growing another rare earth oxide on said rare earth oxide at a growth temperature higher than the growth temperature of said rare earth oxide after said rare earth oxide is epitaxially grown.

23. A crystal growth method of an oxide comprising the steps of:

processing a surface of a (001)-oriented silicon substrate into a dimmer structure by 2×1, 1×2 surface reconstruction;

epitaxially growing a rare earth oxide of a cubic system or tetragonal system in the (001) orientation on said silicon substrate; and wherein a silicon oxide film or a defective layer not thicker than 5 nm is formed along the interface between said silicon substrate and said rare earth oxide.

24. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate by using a source material containing at least one kind of rare earth element in an atmosphere containing an oxidic gas; and annealing said rare earth oxide in vacuum with a pressure not higher than 1×10–6 Torr at a temperature not lower than the growth temperature of said rare earth oxide after said rare earth oxide is epitaxially grown.

25. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate by using a source material containing at least one kind of rare earth element in an atmosphere containing an oxidic gas; and homoepitaxially growing another rare earth oxide on said rare earth oxide at a growth temperature higher than the growth temperature of said rare earth oxide after said rare earth oxide is epitaxially grown.

26. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate by using a source material containing at least one kind of rare earth element in an atmosphere containing an oxidic gas; and wherein a silicon oxide film or a defective layer not thicker than 5 nm is formed along the interface between said silicon substrate and said rare earth oxide.

27. A crystal growth method of an oxide comprising the steps of:

processing a surface of a (001)-oriented silicon substrate into a dimer structure by 2×1, 1×2 surface reconstruction;

epitaxially growing a rare earth oxide of a cubic system or tetragonal system in the (001) orientation on said silicon substrate by using a source material containing at least one kind of rare earth element in an atmosphere containing an oxidic gas; and wherein said rare earth oxide is epitaxially grown at a growth temperature not higher than 100° C.

28. A manufacturing method of a field effect transistor comprising the steps of:

processing a surface of a (001)-oriented silicon substrate into a dimer structure by 2×1, 1×2 surface reconstruction;

forming a gate insulating film by epitaxially growing a rare earth oxide of a cubic system or tetragonal system in the (001) orientation on said silicon substrate; and wherein said gate insulating film is formed by epitaxially growing said rare earth oxide on said silicon substrate at a growth temperature lower than 100° C.

29. A manufacturing method of a field effect transistor comprising the steps of:

processing a surface of a (001)-oriented silicon substrate into a dimer structure by 2×1, 1×2 surface reconstruction;

forming a gate insulating film by epitaxially growing a rare earth oxide of a cubic system or tetragonal system in the (001) orientation on said silicon substrate; and wherein said surface of the silicon substrate is processed into said dimer structure by heating said silicon substrate in vacuum with a pressure not higher than 1×10–6 Torr and thereby vaporizing a silicon oxide film from said surface, and said gate insulating film is formed by epitaxially growing said rare earth oxide on said silicon substrate.

* * * * *